(12) United States Patent
Aikawa

(10) Patent No.: US 6,388,945 B2
(45) Date of Patent: May 14, 2002

(54) SEMICONDUCTOR MEMORY DEVICE OUTPUTTING DATA ACCORDING TO A FIRST INTERNAL CLOCK SIGNAL AND A SECOND INTERNAL CLOCK SIGNAL

(75) Inventor: Tadao Aikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/811,521

(22) Filed: Mar. 20, 2001

(30) Foreign Application Priority Data

Mar. 30, 2000 (JP) ........................................ 2000-095826

(51) Int. Cl.$^7$ ................................................. G11C 8/00
(52) U.S. Cl. ........................................ 365/233; 365/194
(58) Field of Search .................... 365/76, 207, 189.07, 365/230.01, 233, 194; 327/156, 158

(56) References Cited

U.S. PATENT DOCUMENTS 6,066,968 A * 5/2000 Yang ........................... 327/156
6,292,040 B1 * 9/2001 Iwamato ...................... 327/158

* cited by examiner

*Primary Examiner*—A. Zarabian
(74) *Attorney, Agent, or Firm*—Arent Fox Kintner Plotkin & Kahn, PLLC

(57) ABSTRACT

A semiconductor memory device outputs data in synchronization with an external clock signal. The semiconductor memory device comprises a first frequency divider dividing a frequency of the external clock signal supplied thereto so as to generate a first internal clock signal; a delay circuit delaying the external clock signal; a second frequency divider dividing a frequency of a signal supplied from the delay circuit so as to generate a second internal clock signal; and a data control unit outputting the data according to the first internal clock signal and the second internal clock signal.

7 Claims, 18 Drawing Sheets

SEMICONDUCTOR MEMORY DEVICE OUTPUTTING DATA ACCORDING TO A FIRST INTERNAL CLOCK SIGNAL AND A SECOND INTERNAL CLOCK SIGNAL

BACKGROUND OF THE INVENTION

1. Field of the Invention

The present invention generally relates to a semiconductor memory device and, more particularly, to a semiconductor memory device for inputting and outputting data in synchronization with an external clock signal.

2. Description of the Related Art

Recently, a Dynamic Random Access Memory (DRAM) has been facing requirements, such as to operate at high speed, to consume less electric power, and to have a high-speed interface. In this trend, a Synchronized DRAM (SDRAM) is a mainstream type of the DRAM, the SDRAM inputting and outputting data in synchronization with a clock signal. Even a DDR (Double Data Rate) type is proposed to enhance an interface speed This DDR type outputs data by using a clock signal CK and a reverse clock signal /CK so as to increase an output rate. In any type of the DRAM, an operating frequency has to be increased so as to achieve a high-speed interface.

However, when a high-frequency clock signal controls an internal operation, a margin in a specification becomes smaller as the frequency of the clock signal becomes higher, making it difficult to guarantee a reliability of the internal operation. Therefore, an operating frequency of the internal operation has to be decreased by such method as a frequency dividing.

The above-mentioned decrease in an operating frequency is especially employed in controlling a data output. Hereinafter, a description will be given, with reference to the drawings, of a conventional semiconductor memory device having this function.

FIG. 1 is an illustration of a structure of a conventional semiconductor memory device. As shown in FIG. 1, the conventional semiconductor memory device comprises: pads 1, 3, 5 and 33; clock buffers 7 and 8; a command buffer 9; a frequency divider 11; a command recognition unit 13; a DLL (Delayed Locked Loop) circuit 15; an output signal generating circuit 17; a 0° logic circuit 19; a 180° logic circuit 21; an output control unit 23; a readout circuit 25; a memory 27; a data control unit 29; and an output buffer 31. The 0° logic circuit 19 includes a read-command angle recognition circuit (0°) 35 and a counter (0°) 39. The 180° logic circuit 21 includes a read-command angle recognition circuit (180°) 37 and a counter (180°) 41.

Each of the clock buffers 7 and 8 is connected to the pads 1 and 3, the pad 1 supplied with an external clock signal ck, and the pad 3 supplied with an external clock signal /ck. The command buffer 9 is connected to the pad 5 supplied with a command com. The frequency divider 11 is connected to the clock buffers 7 and 8. The command recognition unit 13 is connected to the clock buffer 7 and the command buffer 9. The DLL circuit 15 is connected to the frequency divider 11.

The output signal generating circuit 17 is connected to the DLL circuit 15. Each of the 0° logic circuit 19 and the 180° logic circuit 21 is connected to the frequency divider 11, the command recognition unit 13 and the DLL circuit 15. The output control unit 23 is connected to the 0° logic circuit 19 and the 180° logic circuit 21. The readout circuit 25 is connected to the command recognition unit 13. The memory 27 is connected to the readout circuit 25. The data control unit 29 is connected to the readout circuit 25 and the output control unit 23. The output buffer 31 is connected to the data control unit 29 and the output signal generating circuit 17. The pad 33 outputting data D is connected to the output buffer 31.

Hereinafter, a description will be given, with reference to the drawings, of operations of the conventional semiconductor memory device having the above-mentioned structure. The external clock signal ck supplied to the pad 1 and the external clock signal /ck supplied to the pad 3 are buffered by the clock buffers 7 and 8, and are supplied to the frequency divider 11 as an internal clock signal clkz from the clock buffer 7 and an internal clock signal clkx from the clock buffer 8. Then, the frequency divider 11 divides frequencies of the internal clock signals clkz and clkx so as to generate internal clock signals clke0z, clke18z, clko0z and clko18z.

On the other hand, the command com supplied to the pad 5 is buffered by the command buffer 9, and is supplied to the command recognition unit 13. Then, the command recognition unit 13 generates a read-command read and supplies the read-command read to the read-command angle recognition circuit (0°) 35, the read-command angle recognition circuit (180°) 37 and the readout circuit 25. The read-command angle recognition circuit (0°) 35 detects whether the read-command read is supplied in synchronization with the internal clock signal clke0z, and supplies an output control signal to the output control unit 23. The read-command angle recognition circuit (180°) 37 detects whether the read-command read is supplied in synchronization with the internal clock signal clke18z, and supplies an output control signal to the output control unit 23. In this course, a phase of the internal clock signal clke18z is different to a phase of the internal clock signal clke0z by 180°.

The DLL circuit 15 delays the internal clock signals clke0z, clke18z, clko0z and clko18z generated by the frequency divider 11 by a predetermined time so as to generate internal clock signals oclke0z, oclke18z, oclko0z and oclko18z which seem as if being a transmission time $T_{AC}$ ahead of the internal clock signals clke0z, clke18z, clko0z and clko18z in phases, the transmission time $T_{AC}$ corresponding to a path 43 from the DLL circuit 15 to the pad 33.

Hereinafter, a description will be given, with reference to FIG. 2, of data-read operations of the conventional semiconductor memory device shown in FIG. 1. FIG. 2 is a waveform diagram indicating operations of the conventional semiconductor memory device. The description will be made of a case where a latency is six. That is, as indicated by FIG. 2-(a) and FIG. 2-(m), data Dn (n is a natural number) are output from the pad 33 at a time To which is six periods (clocks) of the external clock signal ck behind a time Ti at which a read-command read is supplied to the pad 5.

First, as shown by waveforms 46 indicated by FIG. 2-(b) to FIG. 2-(e), the internal clock signals clke0z, clke18z, clko0z and clko18z are generated by the frequency divider 11 dividing by two the frequencies of the internal clock signals clkz and clkx based on the external clock signal ck. Waveforms 44 indicate the internal clock signals clke0z and clke18z being in synchronization with the external clock signal ck. Waveforms 45 indicate the internal clock signals clko0z and clko18z in being synchronization with the external clock signal /ck reverse to the external clock signal ck. The internal clock signals clke18z and clko18z are different in phases to the internal clock signals clke0z and clko0z by 180°, respectively.

Therefore, as indicated by FIG. 2-(b) and FIG. 2-(c), the internal clock signal clke0z, for example, comprises only even-numbered clocks of the external clock signal ck, and the internal clock signal clke18z, for example, comprises only odd-numbered clocks of the external clock signal ck.

Waveforms 47 indicate the signals delayed by the DLL circuit 15 Waveforms 48 correspond to the waveforms 44, and waveforms 49 correspond to the waveforms 45. That is, a clock numbered 4 of the internal clock signal clke0z indicated by FIG. 2-(b), for example, is delayed by the DLL circuit 15 by a predetermined time to become a clock numbered 6 of the internal clock signal oclke0z indicated by FIG. 2-(f).

On the other hand, the read-command angle recognition circuit (0°) 35 recognizes a reception of the read-command read with a phase difference 0° to the external clock signal ck based on the supplied internal clock signal clke0z so as to generate a signal ractp0z indicated by FIG. 2-(j). This signal ractp0z is at a high level for one period of the supplied internal clock signal clke0z, and is supplied to the counter (0°) 39. It is noted that the read-command angle recognition circuit (180°) 37 recognizes a reception of the read-command read with a phase difference 180° to the external clock signal ck based on the supplied internal clock signal clke18z so as to operate in the same manner as the above-mentioned read-command angle recognition circuit (0) 35.

Then, the counter (0) 39 generates signals latz and oe0z indicated by FIG. 2-(k) and FIG. 2-(l) one by one in response to the internal clock signals oclko0z and oclko18z supplied from the DLL circuit 15. Then, from the time To, in response to the clocks numbered 6 and after of the internal clock signal oclke0z indicated by FIG. 2-(f), data D1 to D4 with the latency of 6 are supplied via the data control unit 29 to the output buffer 31 and are output from the pad 33 one by one.

The readout circuit 25 reads the above-mentioned data D1 to D4 from the memory 27 in response to the read-command read, and supplies the data D1 to D4 to the data control unit 29. The data control unit 29 supplies the data D1 to D4 to the output buffer 31 in response to a data control signal supplied from the output control unit 23. The output buffer 31 supplies the data D1 to D4 to the pad 33 in response to signals outp1x and outp2x supplied from the output signal generating circuit 17.

The heretofore mentioned is the description of data-read operations of the conventional semiconductor memory device shown in FIG. 1. Hereinafter, descriptions will be given of specific circuit examples of elements composing the conventional semiconductor memory device shown in FIG. 1.

FIG. 3 is an illustration of a structure of the DLL circuit 15 shown in FIG. 1. As shown in FIG. 3, the DLL circuit 15 comprises a replica circuit 90, a first delay circuit 91, a second delay circuit 92, a shift register 93, a ½ frequency dividing circuit 94, and a phase comparator 55. The first delay circuit 91 and the second delay circuit 92 have the same circuit structure. The replica circuit 90 comprises a resistance 95, an output buffer (dummy) 96, a dummy capacitance 97, a clock buffer (dummy) 98, and a dummy frequency divider 99, these elements being connected in series in this order. The dummy frequency divider 99 comprises a circuit having a same delay time as the frequency divider 11 shown in FIG. 1, and supplies a supplied signal to the phase comparator 55 without dividing a frequency thereof.

The ½ frequency dividing circuit 94 is supplied with the internal clock signal clke0z. The phase comparator 55 is connected to the ½ frequency dividing circuit 94 and the dummy frequency divider 99. An input terminal of the shift register 93 is connected to the phase comparator 55, and the shift register 93 controls the second delay circuit 92. An input terminal of the second delay circuit 92 is connected to the ½ frequency dividing circuit 94, and an output terminal of the second delay circuit 92 is connected to the resistance 95. The second delay circuit 92 adjusts a delay time in the first delay circuit 91 so that the delay time in the first delay circuit 91 matches a delay time in the second delay circuit 92.

Here, the first delay circuit 91 is supplied with the internal clock signals clke0z, clke18z, clko0z and clko18z, and generates and outputs the internal clock signals oclke0z, oclke18z, oclko0z and oclko18z delayed by the same time as the delay time of the second delay circuit 92. Additionally, the above-mentioned replica circuit 90 has the same delay time as an "internal clock path", which is a path from the clock buffers 7 and 8 via the first delay circuit 91 to the output buffer 31, because the replica circuit 90 has the same structure of circuits as the "internal clock path".

Next, a description will be given of operations of the above-mentioned DLL circuit 15. An optimal number of delay stages in the first and second delay circuits 91 and 92 is specified by the shift register 93. The shift register 93 is controlled by the phase comparator 55. The phase comparator 55 compares a dummy clock signal clkr supplied from the replica circuit 90 and a clock signal clkout supplied from the ½ frequency dividing circuit 94, and controls the shift register 93 so that a phase of the dummy clock signal clkr is delayed from a phase of the clock signal clkout by one period of the internal clock signal clke0z. Thereby, the delay time in the "internal clock path" becomes a time equivalent to one period of the internal clock signal clke0z. Therefore, output data are varied at rise times of the external clock signal ck, regardless of a frequency of the external clock signal ck.

It is noted that the ½ frequency dividing circuit 94 has a frequency division rate of 2 so that the phase comparator 55 conducts the above-mentioned phase comparison based on a clock one clock behind the corresponding clock of the signals supplied to the first delay circuit 91.

Hereinbelow, a more detailed description will be given, with reference to FIG. 4, of operations of the above-mentioned DLL circuit 15. FIG. 4 is a waveform diagram indicating the operations of the DLL circuit 15. It is noted that, in this description, data is output at the time To.

First, the external clock signal ck indicated by FIG. 4-(a) supplied to the pad 1 is frequency-divided by the frequency divider 11 shown in FIG. 1 so that the internal clock signal clke0z indicated by FIG. 4-(B) is generated. It is noted that, as indicated by FIG. 4-(a) and FIG. 4-(b), clocks of the external clock signal ck are numbered with sequential integers from 0, and clocks of the generated internal clock signal clke0z are numbered with the same numbers, i.e., the even numbers, as the clocks of the external clock signal ck having the same rise time.

Then, a frequency of the internal clock signal clke0z is divided by 2 in the ½ frequency dividing circuit 94 so that the clock signal clkout indicated by FIG. 4-(c) is generated. Then, this clock signal clkout is transmitted through the second delay circuit 92 and the replica circuit 90 so that the dummy clock signal clkr indicated by FIG. 4-(d) is generated. As indicated by FIG. 4-(d), a phase of the dummy clock signal clkr is delayed from a phase of the clock signal clkout by a delay time Dt in the replica circuit 90.

At the time To, the phase comparator 55 controls the shift register 93 so that a rising edge of the dummy clock signal clkr matches a falling edge of the clock signal clkout. Thereby, the delay time in the second delay circuit 92 and the first delay circuit 91 is made a time from a time T3 to the time To. Therefore, as indicated by FIG. 4-(e), the internal clock signal oclke0z output from the first delay circuit 91 is delayed from the internal clock signal clke0z supplied to the first delay circuit 91 by a time from a time T1 to a time T2, which is the same time as the time from the time T3 to the time To. For example, as indicated by FIG. 4-(e), a clock numbered 4 of the internal clock signal oclke0z corresponds to a clock numbered 2 of the internal clock signal clke0z.

Then, as indicated by FIG. 4-(f), at the time To, data is output from the pad 33 in response to the clock numbered 4 of the internal clock signal oclke0z. As a result, the data is output in synchronization with a clock numbered 4 of the external clock signal ck indicated by FIG. 4-(a).

The above-described operations of the DLL circuit 15 shown in FIG. 3 are characterized in that the phase of the dummy clock signal clkr supplied from the replica circuit 90 is adjusted to an edge of the clock signal clkout supplied from the ½ frequency dividing circuit 94, the edge corresponding to a clock one period behind of the internal clock signal clke0z supplied to the first delay circuit 91.

Next, a description will be given, with reference to FIG. 5, of the above-mentioned conventional clock buffer 7. FIG. 5 is a circuit diagram of the conventional clock buffer 7 shown in FIG. 1. It is noted that the clock buffer 8 shown in FIG. 1 has the same structure as shown in FIG. 5.

As shown in FIG. 5, the clock buffer 7 includes inverters INV1 to INV3, N-channel MOS transistors NT1 To NT3, and P-channel MOS transistors PT1 to PT4. The external clock signal ck is supplied to a gate of the N-channel MOS transistor NT2. The external clock signal /ck is supplied to a gate of the N-channel MOS transistor NT3. An enable signal enz is supplied to gates of the N-channel MOS transistor NT1 and the P-channel MOS transistors PT1 and PT4.

When the enable signal enz becomes high-level so that the clock buffer 7 is activated, the internal clock signal clkz according to the external clock signals ck and /ck is generated and is output.

FIG. 6 is a circuit diagram of the conventional frequency divider 11 shown in FIG. 1. As shown in FIG. 6, the frequency divider 11 includes an inverter INV4, a first frequency dividing circuit 11a and a second frequency dividing circuit 11b. The first frequency dividing circuit 11a includes NAND circuits 100 to 108 and an inverter INV5. The second frequency dividing circuit 11b includes NAND circuits 109 to 117 and an inverter INV6.

The first frequency dividing circuit 11a frequency-divides the internal clock signal clkz so as to generate the internal clock signals clke0z and clke18z. The second frequency dividing circuit 11b frequency-divides the internal clock signal clkx so as to generate the internal clock signals clko0z and clko18z. It is noted that the frequency divider 11 is reset by a signal csuz supplied to the inverter INV4.

The heretofore-described conventional semiconductor memory device employs the DDR mode, in which a plurality of external clock signals ck and /ck control a data output. However, the conventional semiconductor memory device of the DDR mode has a disadvantage of involving complicated controls thereof. Additionally, since a plurality of internal clock signals having different phases are generated by frequency-dividing the external clock signals, a number of signal lines is increased so as to transmit the internal clock signals, subsequently augmenting a circuit scale of the DLL circuit 15 and an amount of consumed electric current thereof. Further, the augmented circuit scale of the DLL circuit 15 disadvantageously leads to differences in quality of the signal lines in the DLL circuit 15, deteriorating a precision of the DLL circuit 15.

SUMMARY OF THE INVENTION

It is a general object of the present invention to provide an improved and useful semiconductor memory device in which device the above-mentioned problems are eliminated.

A more specific object of the present invention is to provide a semiconductor memory device which can operate with excellent reliability even at high operating frequencies, the device having a reduced circuit scale and consuming a decreased amount of electric current.

In order to achieve the above-mentioned objects, there is provided according to one aspect of the present invention a semiconductor memory device for outputting data in synchronization with an external clock signal, the device comprising:

a first frequency divider dividing a frequency of the external clock signal supplied thereto so as to generate a first internal clock signal;

a delay circuit delaying the external clock signal;

a second frequency divider dividing a frequency of a signal supplied from the delay circuit so as to generate a second internal clock signal; and a data control unit outputting the data according to the first internal clock signal and the second internal clock signal.

According to the present invention, even when the frequency of the external clock signal is high, an internal operating frequency can be reduced so as to output data from the data control unit in synchronization with the external clock signal, and at the same time, a number of signals supplied to the delay circuit can be decreased.

Additionally, in the semiconductor memory device according to the present invention, the delay circuit supplies a signal having a phase different from a phase of the external clock signal by N periods, where N is an integer other than zero.

According to the present invention, the first frequency divider and the second frequency divider can be synchronized with each other.

Additionally, in the semiconductor memory device according to the present invention, the delay circuit adjusts a phase of the external clock signal supplied thereto by delaying the external clock signal by 2n periods, where n is a natural number.

According to the present invention, the first frequency divider and the second frequency divider can be synchronized with each other easily.

Additionally, the semiconductor memory device according to the present invention may further comprise a reset circuit simultaneously starting the first frequency divider and the second frequency divider.

According to the present invention, operations of the first frequency divider and the second frequency divider can be guaranteed.

Specifically, in the semiconductor memory device according to the present invention, the reset circuit starts the first frequency divider and the second frequency divider upon being provided with a power supply.

According to the present invention, operations of the first frequency divider and the second frequency divider can be surely guaranteed.

Additionally, in the semiconductor memory device according to the present invention, the reset circuit may be controlled by a command supplied from outside.

According to the present invention, operations of the first frequency divider and the second frequency divider can have an enhanced degree of freedom.

In order to achieve the above-mentioned objects, there is also provided according to another aspect of the present invention a semiconductor memory device having a clock buffer buffering an external clock signal supplied thereto, and a data control unit outputting predetermined data according to a data control signal supplied thereto, the device outputting the data in synchronization with the external clock signal, the device comprising:

a delay circuit delaying a signal generated by the clock buffer;

a first frequency divider dividing a frequency of the signal generated by the clock buffer so as to generate a first internal clock signal;

a second frequency divider dividing a frequency of a signal supplied from the delay circuit so as to generate a second internal clock signal; and an output control unit generating the data control signal according to the first internal clock signal and the second internal clock signal.

According to the present invention, even when the frequency of the external clock signal is high, the data control signal generated according to the first internal clock signal and the second internal clock signal each having a decreased frequency enables the data output from the data control unit in synchronization with the external clock signal, and a number of signals supplied to the delay circuit can be reduced.

Other objects, features and advantages of the present invention will become more apparent from the following detailed description when read in conjunction with the accompanying drawings.

DETAILED DESCRIPTION OF THE PREFERRED EMBODIMENTS

Figure 1:
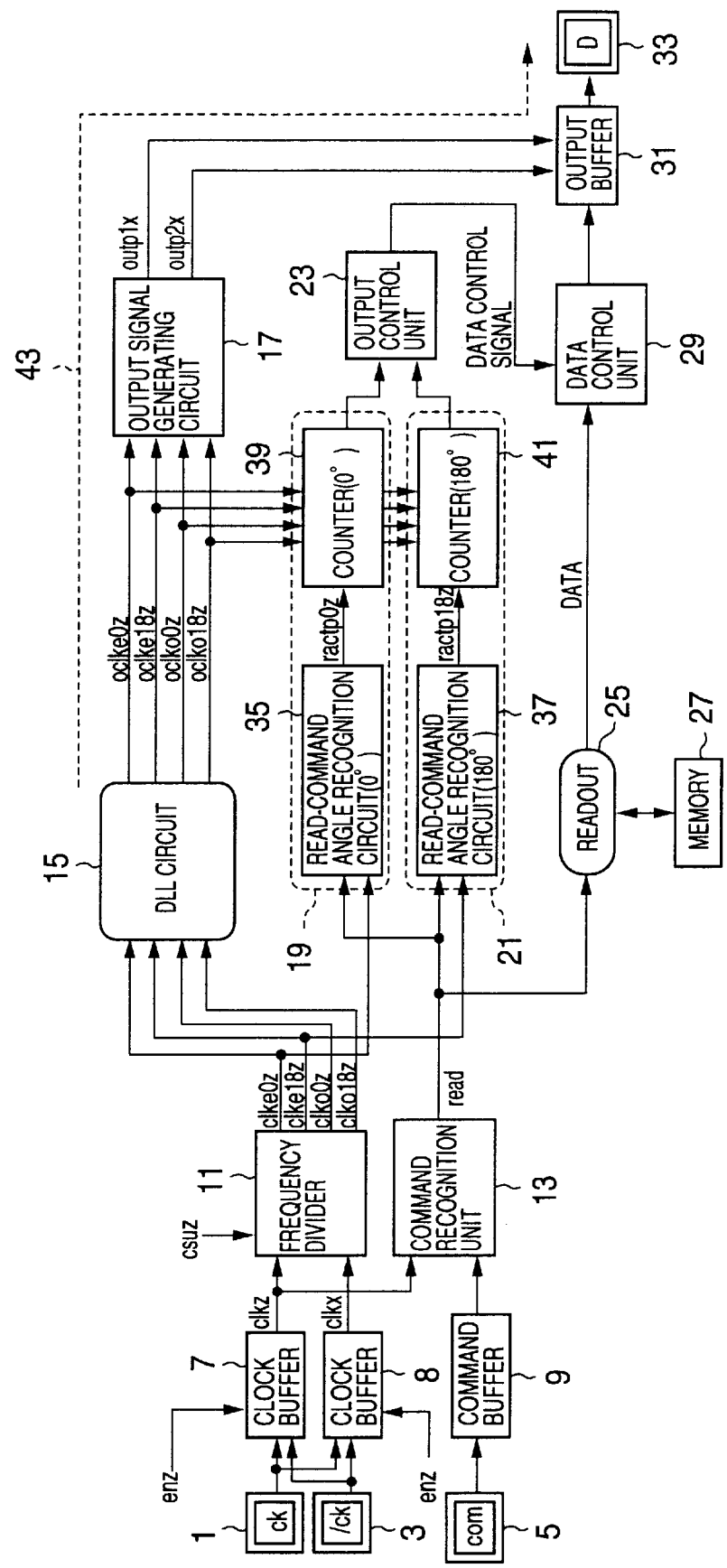
FIG. 1 is an illustration of a structure of a conventional semiconductor memory device.
Figure 2:
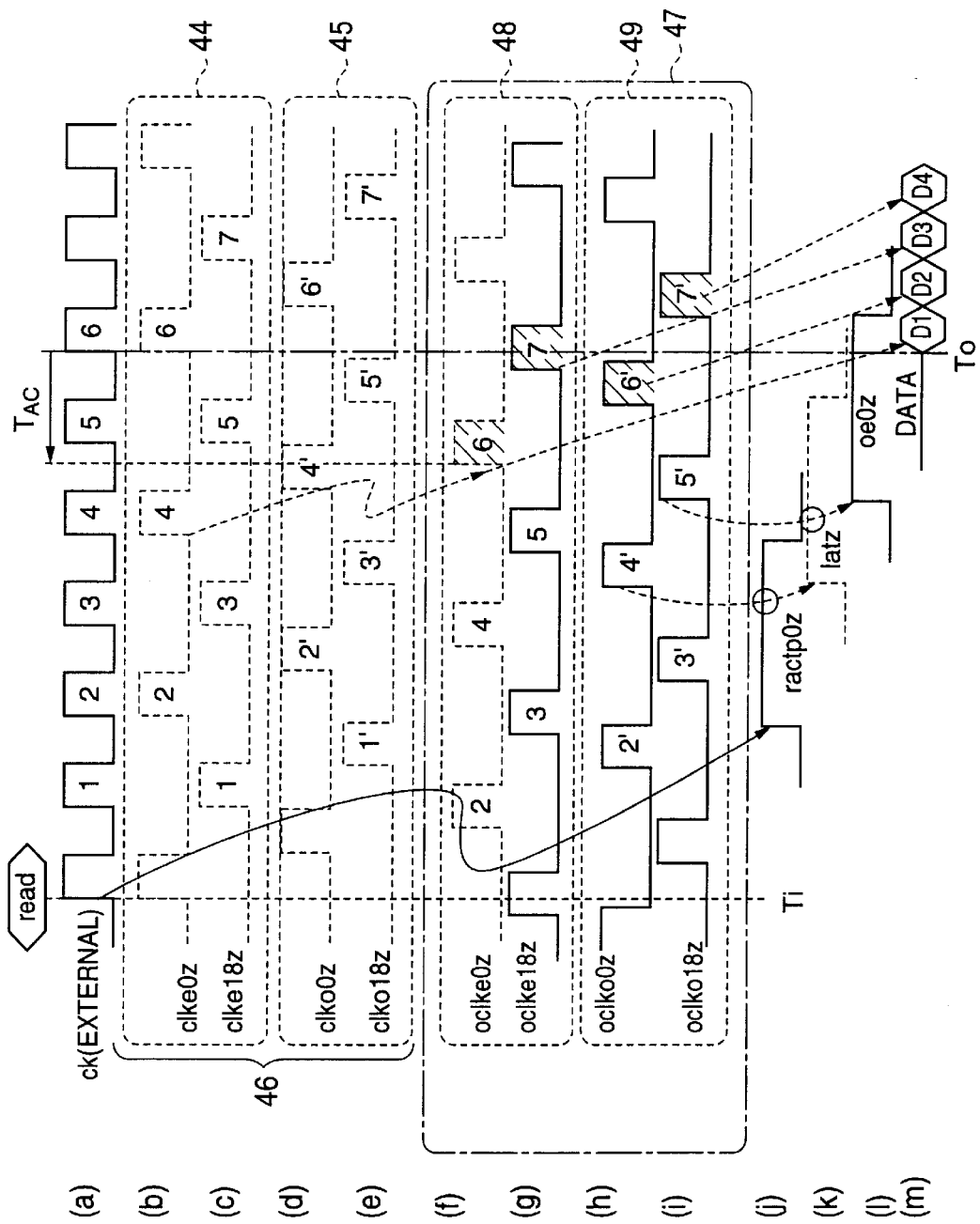
FIG. 2 is a waveform diagram indicating operations of the conventional semiconductor memory device shown in FIG. 1.
Figure 3:
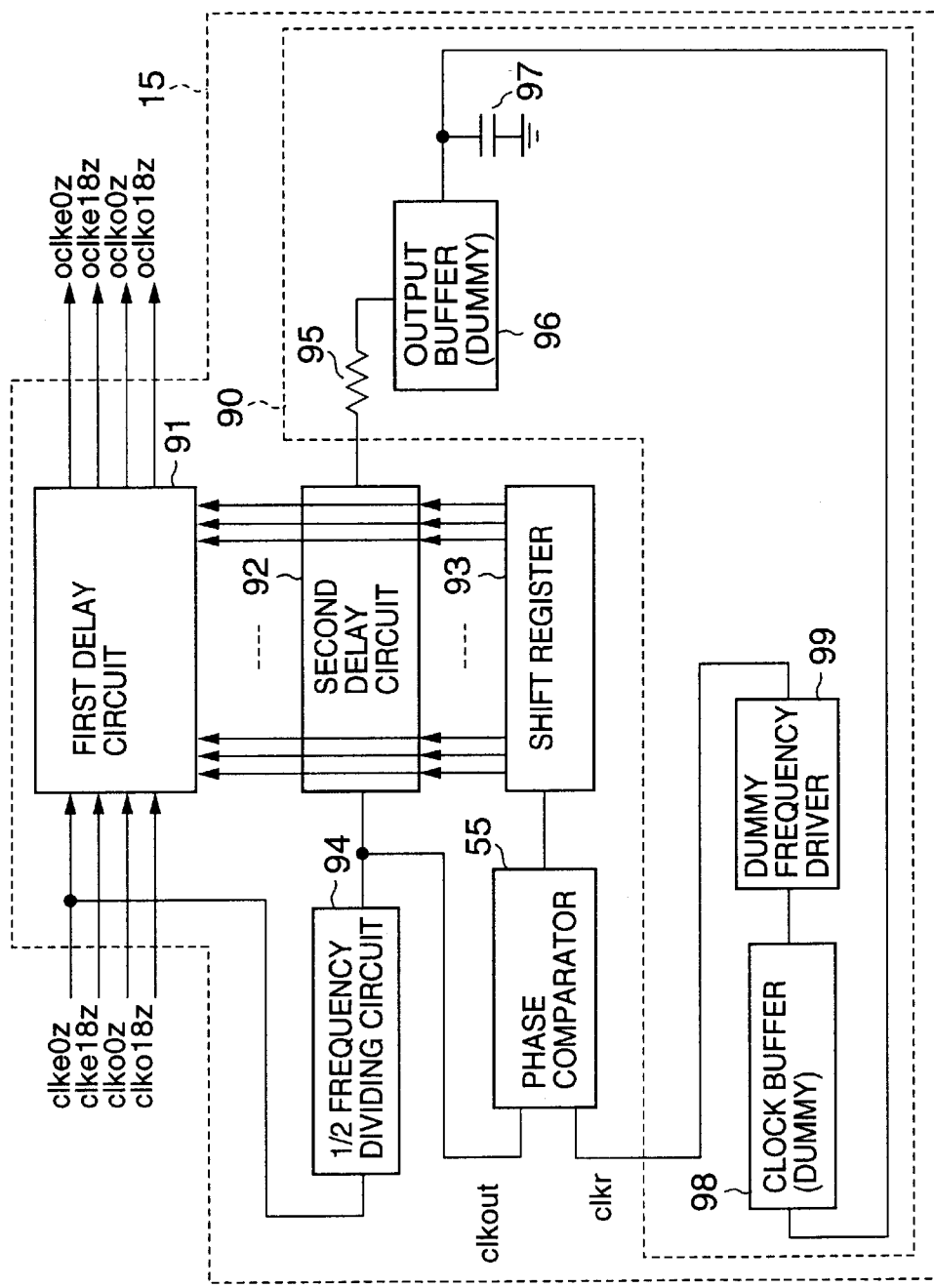
FIG. 3 is an illustration of a structure of a DLL circuit shown in FIG. 1.
Figure 4:
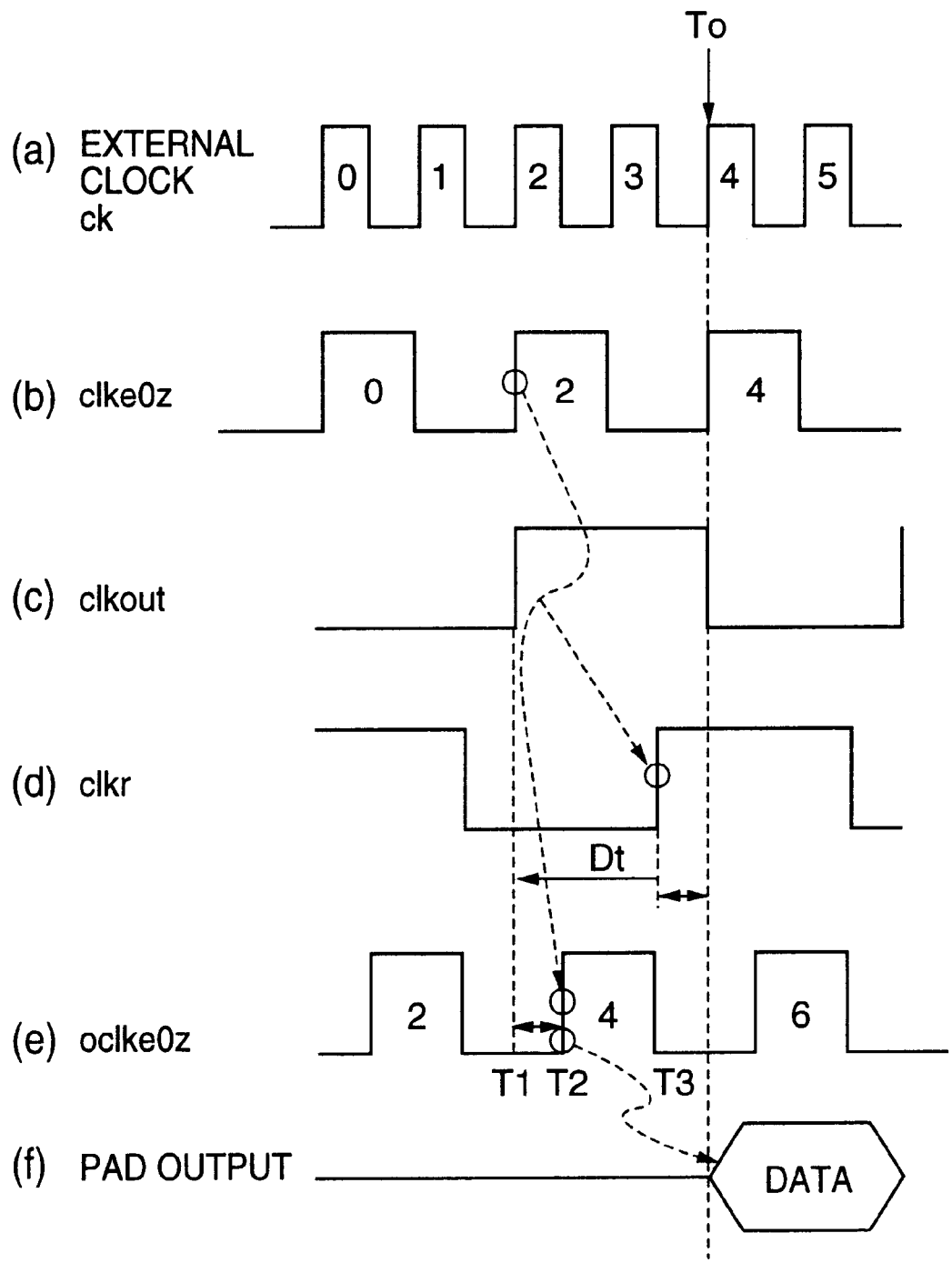
FIG. 4 is a waveform diagram indicating operations of the DLL circuit shown in FIG. 3.
Figure 5:
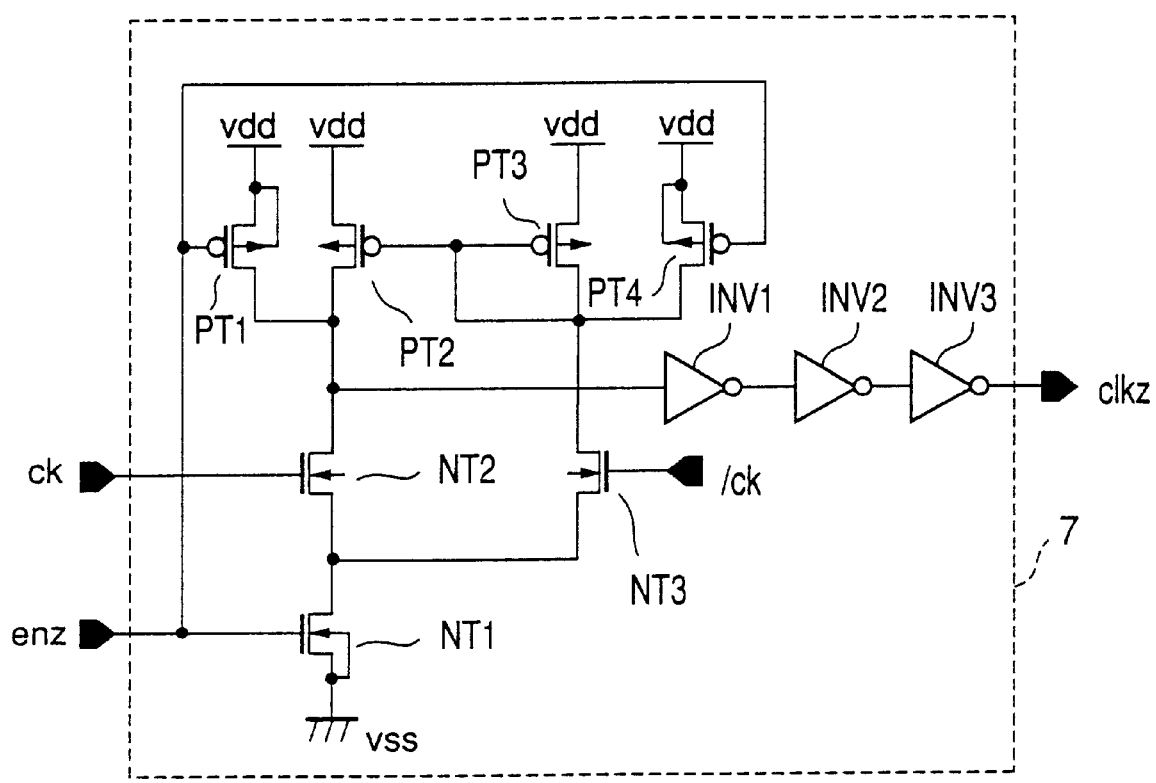
FIG. 5 is a circuit diagram of a clock buffer shown in FIG. 1.
Figure 6:
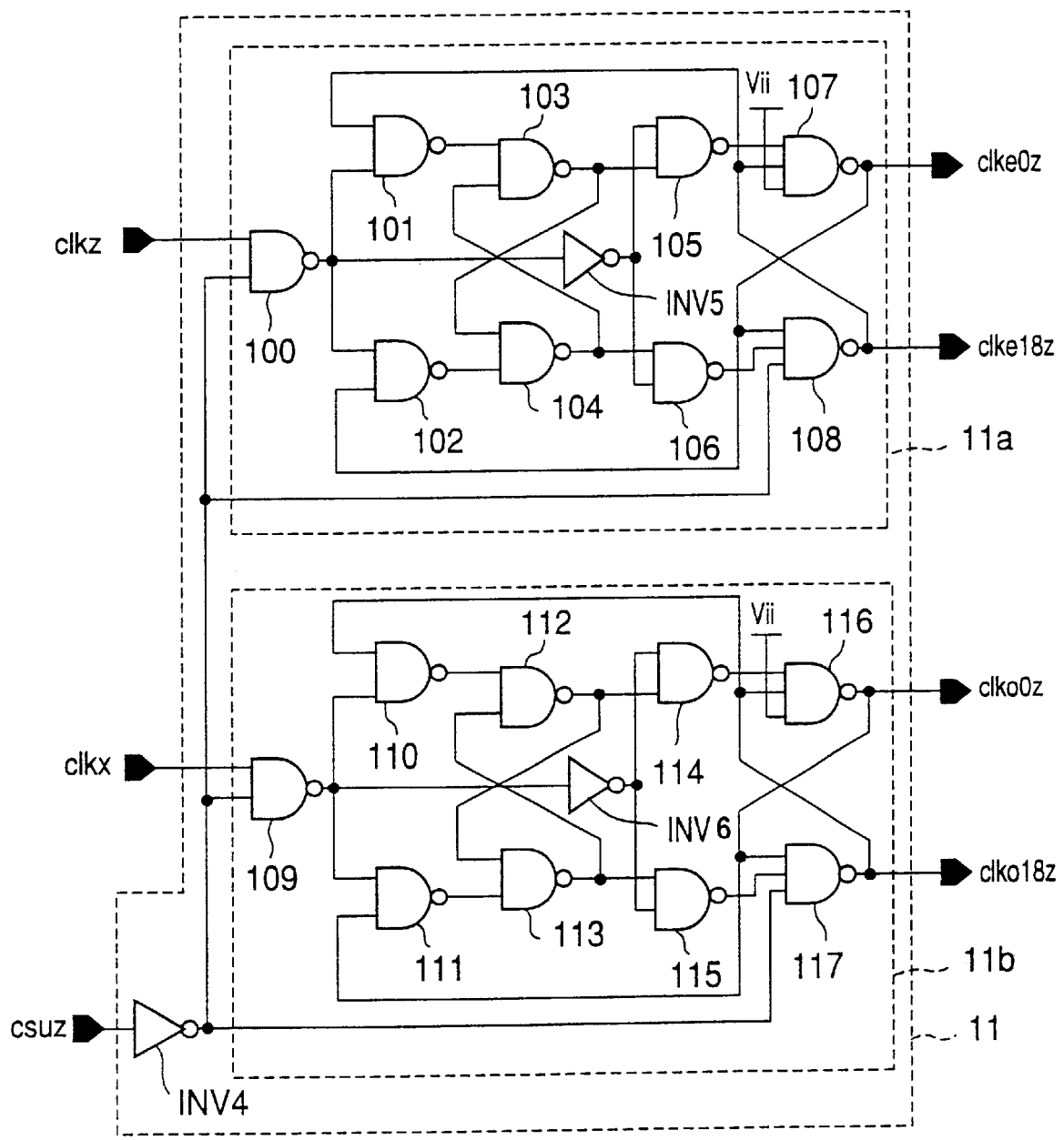
FIG. 6 is a circuit diagram of a frequency divider shown in FIG. 1.

A description will now be given, with reference to the drawings, of embodiments according to the present invention. Elements in the drawings that are identical or equivalent are referenced by the same characters.

Figure 7:
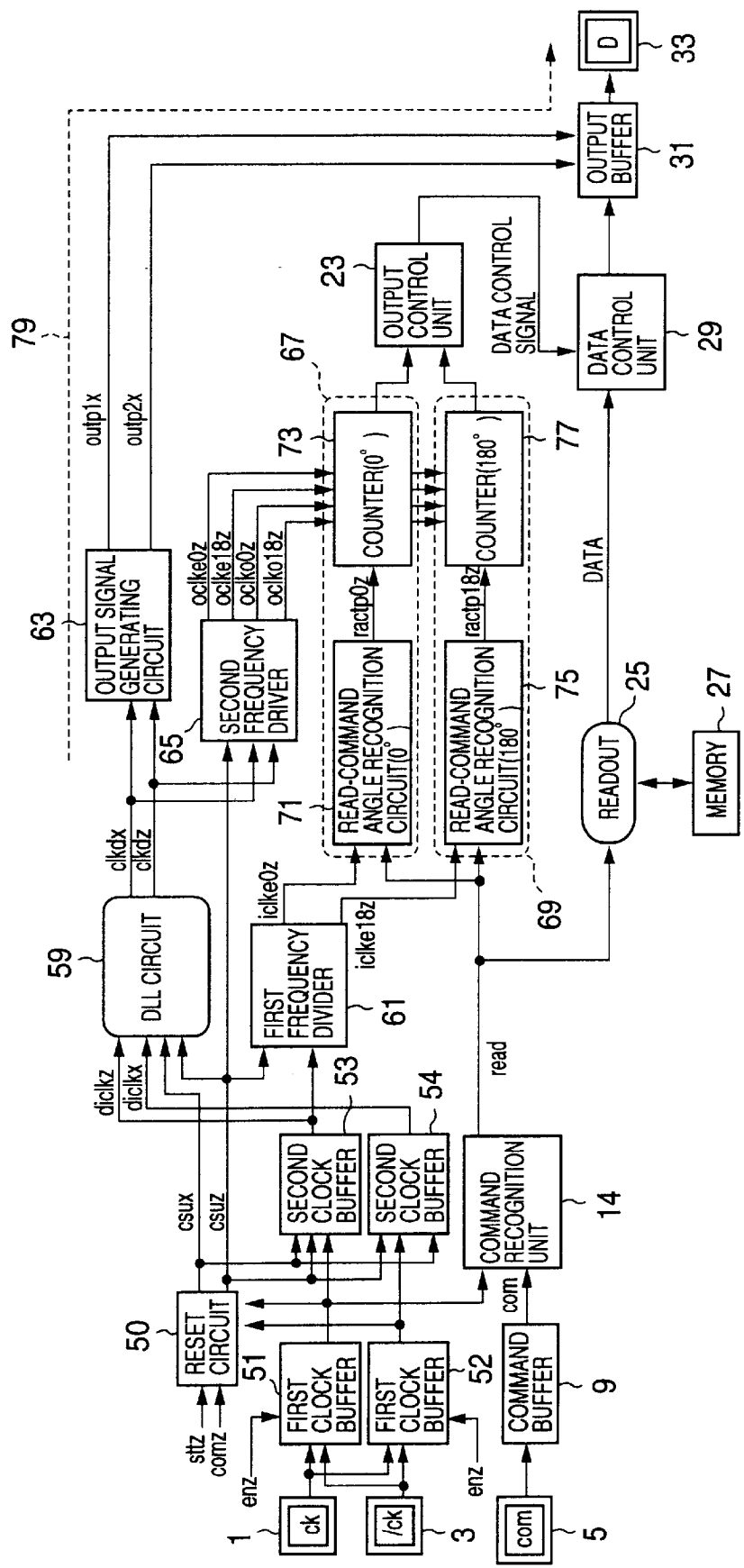
FIG. 7 is an illustration of a structure of a semiconductor memory device according to an embodiment of the present invention.

FIG. 7 is an illustration of a structure of a semiconductor memory device according to an embodiment of the present invention. As shown in FIG. 7, the semiconductor memory device according to the present embodiment comprises: the pads 1, 3, 5 and 33; first clock buffers 51 and 52; second clock buffers 53 and 54; a reset circuit 50; the command buffer 9; a command recognition unit 14; a DLL (Delayed Locked Loop) circuit 59; a first frequency divider 61; a second frequency divider 65; an output signal generating circuit 63; a 0° logic circuit 67; a 180° logic circuit 69; the output control unit 23; the readout circuit 25; the memory 27; the data control unit 29; and the output buffer 31. The 0° logic circuit 67 includes a read-command angle recognition circuit (0°) 71 and a counter (0°) 73. The 180° logic circuit 69 includes a read-command angle recognition circuit (180°) 75 and a counter (180°) 77.

Each of the first clock buffers 51 and 52 is connected to the pads 1 and 3, the pad 1 supplied with the external clock signal ck, and the pad 3 supplied with the external clock signal /ck. The reset circuit 50 is connected to the first clock buffers 51 and 52. The second clock buffers 53 and 54 are connected to the first clock buffers 51 and 52 and the reset circuit 50. The command buffer 9 is connected to the pad 5 supplied with the command com. The command recognition unit 14 is connected to the first clock buffer 51 and the command buffer 9.

The DLL circuit 59 is connected to the reset circuit 50 and the second clock buffers 53 and 54. The first frequency divider 61 is connected to the reset circuit 50 and the second clock buffer 53. The second frequency divider 65 is connected to the reset circuit 50 and the DLL circuit 59.

The output signal generating circuit 63 is connected to the DLL circuit 59. Each of the read-command angle recognition circuit (0°) 71 included in the 0° logic circuit 67 and the read-command angle recognition circuit (180°) 75 included in the 180° logic circuit 69 is connected to the first frequency divider 61 and the command recognition unit 14. The counter (0°) 73 is connected to the read-command angle recognition circuit (0) 71 and the second frequency divider 65. The counter (180°) 77 is connected to the read-command angle recognition circuit (180°) 75 and the second frequency divider 65. The output control unit 23 is connected to the counter (0°) 73 and the counter (180°) 77. The readout circuit 25 is connected to the command recognition unit 14. The memory 27 is connected to the readout circuit 25. The data control unit 29 is connected to the readout circuit 25 and the output control unit 23. The output buffer 31 is connected to the data control unit 29 and the output signal generating circuit 63. The pad 33 outputting the data D is connected to the output buffer 31.

Figure 8:
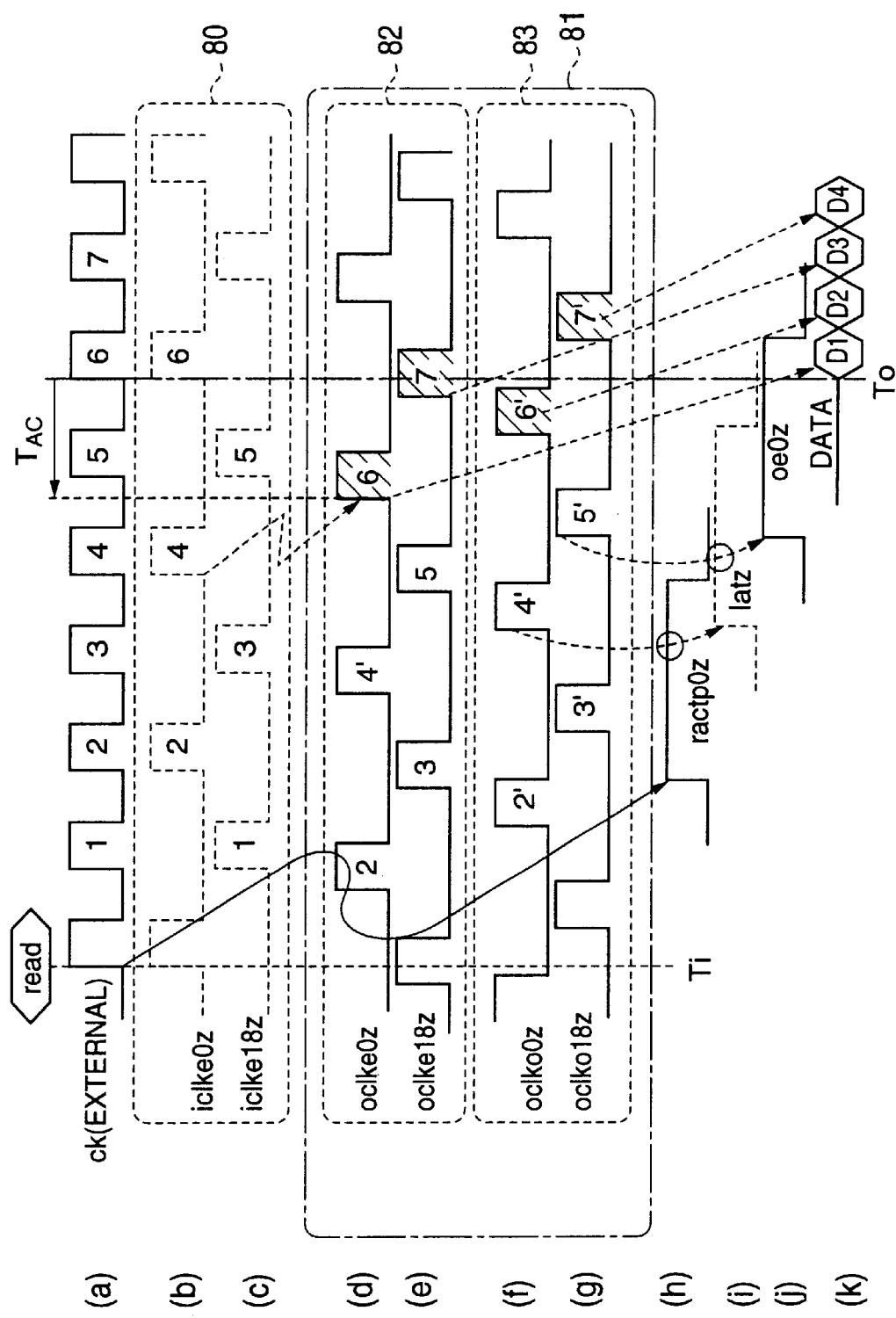
FIG. 8 is a waveform diagram indicating operations of the semiconductor memory device shown in FIG. 7.

The semiconductor memory device according to the present embodiment having the above-described structure is characterized by comprising two frequency dividers and the reset circuit 50 controlling the two frequency dividers. Hereinafter, a description will be given, with reference to FIG. 8, of operations of the semiconductor memory device according to the present embodiment. FIG. 8 is a waveform diagram indicating the operations of the semiconductor memory device shown in FIG. 7. The description will be made of a case where a latency is 6. That is, as indicated by FIG. 8-(a) and FIG. 8-(k), the data Dn (n is a natural number) are output from the pad 33 at a time To which is six periods (clocks) of the external clock signal ck behind a time Ti at which the read-command read is supplied to the pad 5.

First, the external clock signal ck indicated by FIG. 8-(a) supplied to the pad 1 and the external clock signal /ck being a reverse signal thereof are supplied to the first clock buffers 51 and 52, and are buffered thereby so that internal clock signals pdiclkx and pdiclkz are generated, respectively. The internal clock signals pdiclkx and pdiclkz are supplied to the second clock buffers 53 and 54, respectively.

Here, signals csux and csuz supplied from the reset circuit 50 control whether the second clock buffers 53 and 54 are activated or deactivated, as described in detail later. When the second clock buffers 53 and 54 are activated, the second clock buffers 53 and 54 supply internal clock signals diclkz and diclkx generated according to the internal clock signals pdiclkx and pdiclkz to the DLL circuit 59, and the second clock buffer 53 also supplies the internal clock signal diclkz to the first frequency divider 61. In the above description, frequencies of the internal clock signals diclkz and diclkx supplied to the DLL circuit 59 are not divided with respect to the external clock signals ck and /ck supplied to the pads 1 and 3. Therefore, a number of internal clock signals supplied to the DLL circuit 59 is decreased compared with the conventional semiconductor memory device shown in FIG. 1. Thus, the DLL circuit 59 according to the present embodiment can reduce a circuit scale thereof compared with the DLL circuit 15 of the conventional semiconductor memory device shown in FIG. 1.

On the other hand, the internal clock signal pdiclkx is supplied from the first clock buffer 51 to the command recognition unit 14. Then, the command recognition unit 14 recognizes the command com, such as the read-command read, a write-command and a test-mode command, supplied thereto from the pad 5 via the command buffer 9. Then, for example, when the command recognition unit 14 recognizes the read-command read, the command recognition unit 14 supplies the read-command read to the read-command angle recognition circuit (0°) 71, the read-command angle recognition circuit (180°) 75 and the readout circuit 25 so as to conduct operations that send data read from the memory 27 to the data control unit 29.

Additionally, the first frequency divider 61 divides the frequency of the supplied internal clock signal diclkz by 2 so as to generate internal clock signals iclke0z and iclke18z indicated by waveforms 80 of FIG. 8-(b) to FIG. 8-(c). A phase of this internal clock signal iclke18z is different to a phase of the internal clock signal iclke0z by 180°. Therefore, as indicated by FIG. 8-(b) and FIG. 8-(c), the internal clock signal iclke0z, for example, comprises only even-numbered clocks of the external clock signal ck, and the internal clock signal iclke18z, for example, comprises only odd-numbered clocks of the external clock signal ck. Then, the internal clock signal iclke0z is supplied to the read-command angle recognition circuit (0°) 71, and the internal clock signal iclke18z is supplied to the read-command angle recognition circuit (180°) 75.

Further, when the read-command angle recognition circuit (0°) 71 judges that the supplied read-command read is input at the time Ti in synchronization with the internal clock signal iclke0z as indicated by FIG. 8-(b), the read-command angle recognition circuit (0°) 71 generates a signal ractp0z indicated by FIG. 8-(h) and supplies the signal ractp0z to the counter (0°) 73. This signal ractp0z is at a high level for one period of the supplied internal clock signal iclke0z. It is noted that the read-command angle recognition circuit (180°) 75 operates in the same manner as the read-command angle recognition circuit (0°) 71. That is, when the read-command angle recognition circuit (180°) 75 judges that the supplied read-command read is input in synchronization with the internal clock signal iclke18z indicated by FIG. 8-(c), the read-command angle recognition circuit (180°) 75 generates a signal ract18z, and supplies the signal ract18z to the counter (180°) 77.

On the other hand, internal clock signals clkdx and clkdz supplied from the DLL circuit 59 are not frequency-divided with respect to the external clock signals ck and /ck supplied to the pads 1 and 3. These internal clock signals clkdx and clkdz are supplied to the second frequency divider 65, and frequencies thereof are divided therein by 2 so that internal clock signals oclke0z, oclke18z oclko0z and oclko18z indicated by waveforms 81 of FIG. 8-(d) to FIG. 8-(g) are generated therein, and are supplied to the counter (0°) 73 and the counter (180°) 77. It is noted that these internal clock signals oclke0z, oclke18z, oclko0z and oclko18z are used for counting a latency in the counter (0°) 73 and the counter (180°) 77. It is also noted that the internal clock signals oclke0z and oclke18z indicated by waveforms 82 are generated according to the internal clock signal clkdz, and that the internal clock signals oclko0z and oclko18z indicated by waveforms 83 are generated according to the internal clock signal clkdx, as described later.

It is noted that a delay time of the DLL circuit 59 is adjusted so that phases of the internal clock signals oclke0z, oclke18z, oclko0z and oclko18z are seemingly a transmission time $T_{AC}$ ahead of phases of the external clock signals ck and /ck, the transmission time $T_{AC}$ corresponding to a path 79 from the DLL circuit 59 to the pad 33.

Then, the counter (0°) 73 generates signals latz and oe0z indicated by FIG. 8-(i) and FIG. 8-(j) one by one in response to the internal clock signals oclko0z and oclko18z supplied from the second frequency divider 65. Then, from the time To, in response to the clocks numbered 6 and greater of the internal clock signal oclke0z indicated by FIG. 8-(d), the data D1 to D4 with the latency of 6 are supplied via the data control unit 29 to the output buffer 31 and are output from the pad 33 one by one.

In addition, the readout circuit 25 reads the above-mentioned data D1 to D4 from the memory 27 in response to the read-command read, and supplies the data D1 to D4 to the data control unit 29. Then, the data control unit 29 supplies the data D1 to D4 to the output buffer 31 in response to a data control signal supplied from the output control unit 23. Further, the output buffer 31 supplies the data D1 to D4 to the pad 33 in response to signals outp1x and outp2x supplied from the output signal generating circuit 63.

As described above, the semiconductor memory device according to the present embodiment is characterized mainly by comprising two frequency dividers. For this reason, however, phases of the internal clock signals shown in FIG. 8 might fail to have desired relations. Specifically, in a case, for example, where phases of the two internal clock signals iclke0z and iclke18z supplied from the first frequency divider 61 are reverse to each other, even when the command recognition unit 14 receives the read-command read with a phase difference 0° to the external clock signal ck, the command recognition unit 14 recognizes the reception of the read-command read with a phase difference 180° so that the 180° logic circuit 69 is activated. Therefore, count timing of a latency becomes inaccurate so that data are not output at desired timings.

Figure 9:
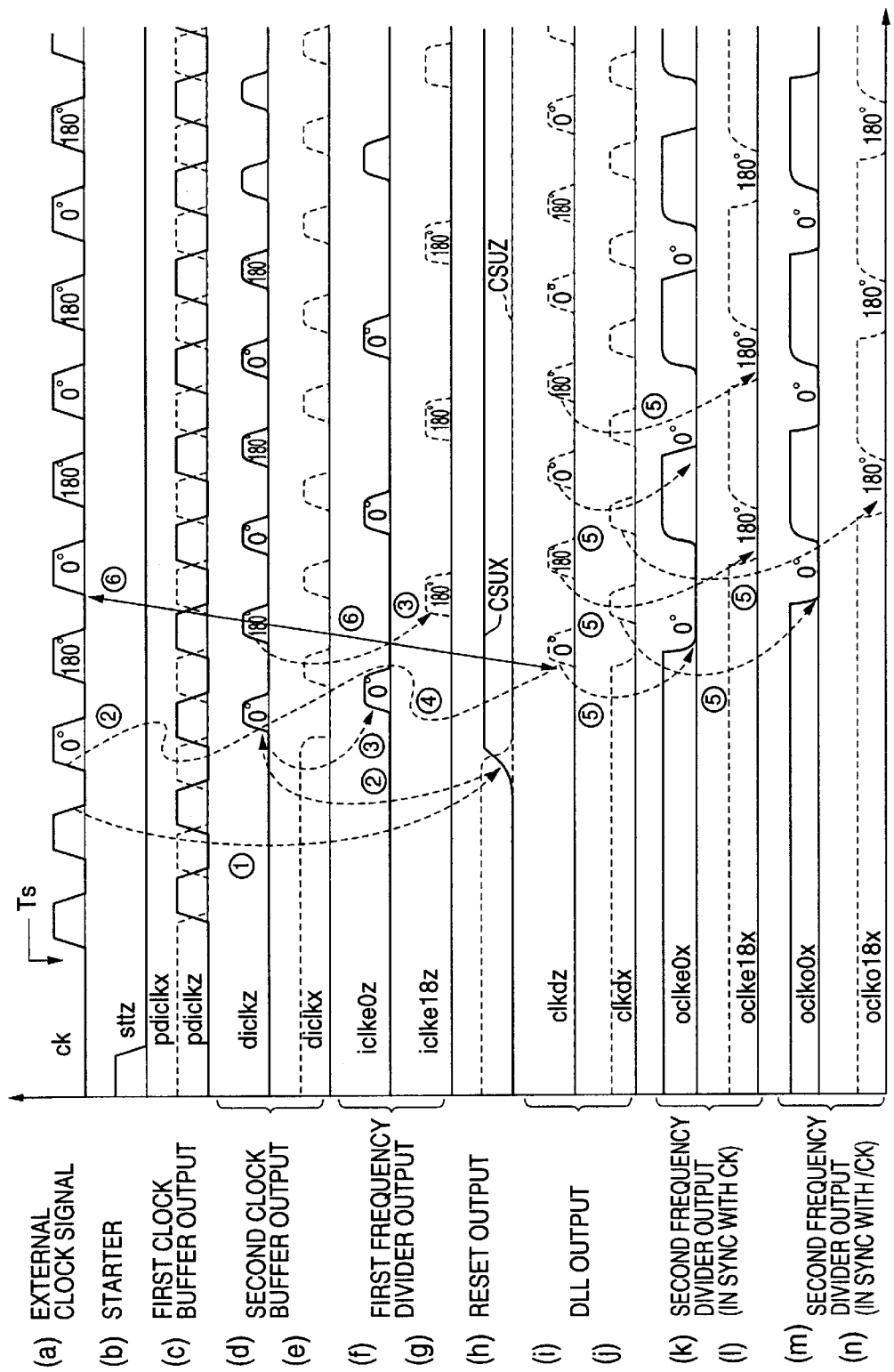
FIG. 9 is a waveform diagram indicating operations of the semiconductor memory device shown in FIG. 7 upon being provided with a power supply.

Therefore, in order to avoid this problem, the first frequency divider 61 and the second frequency divider 65 need to be synchronized with each other. Additionally, because it is difficult to synchronize the first frequency divider 61 and the second frequency divider 65 after the DLL circuit 59 starts operating stably, it is effective to synchronize the first frequency divider 61 and the second frequency divider 65 upon providing a power supply or executing a predetermined command. Hereinafter, a description will be given, with reference to FIG. 9, of operations in a case of synchronizing the first frequency divider 61 and the second frequency divider 65 upon providing a power supply. FIG. 9 is a waveform diagram indicating the operations of the semiconductor memory device shown in FIG. 7 upon being provided with a power supply.

First, as indicated by FIG. 9-(b), when a signal sttz, which transits (rises) to a high level upon provision of a power supply, transits (falls) to a low level after a predetermined time has passed, the reset circuit 50 comes to stand by. Then, as indicated by FIG. 9-(a), when the external clock signal ck is input into the pads 1 and 3 from a time Ts, the reset circuit 50 conducts a 2-clock scaling according to the internal clock signals pdiclkx and pdiclkz indicated by FIG. 9-(c) supplied from the first clock buffers 51 and 52. Then, as indicated by FIG. 9-(h), the reset circuit 50 brings the signal csux to a high level and the signal csuz to a low level (①in FIG. 9).

Thereby, the second clock buffers 53 and 54 are activated. Then, the second clock buffer 53 supplies the DLL circuit 59 and the first frequency divider 61 with the internal clock signal diclkz indicated by FIG. 9-(d) generated according to the internal clock signals pdiclkx (② in FIG. 9). Likewise, the second clock buffer 54 supplies the DLL circuit 59 with the internal clock signal diclkx indicated by FIG. 9-(e) generated according to the internal clock signals pdiclkz.

Then, the first frequency divider 61 starts frequency dividing upon receiving the internal clock signal diclkz. The first frequency divider 61 frequency-divides the internal clock signal diclkz by 2 so as to generate the internal clock signals iclke0z and iclke18z indicated by FIG. 9-(f) and FIG. 9-(g) (③ in FIG. 9). The internal clock signal iclke0z comprises only clocks with a phase 0°, assuming that a first clock of every two clocks composing the internal clock signal diclkz is a clock with a phase 0°. Likewise, the internal clock signal iclke18z comprises only clocks with a phase 180°, assuming that a second clock of every two clocks composing the internal clock signal diclkz is a clock with a phase 180°.

On the other hand, the internal clock signals diclkz and diclkx are supplied, as described above, to the DLL circuit 59 not yet operating stably, and are delayed therein so that the internal clock signals clkdx and clkdz indicated by FIG. 9-(i) and FIG. 9-(j) are generated (④ in FIG. 9). Then, these internal clock signals clkdx and clkdz are frequency-divided by 2 by the second frequency divider 65 so that internal clock signals oclke0x, oclke18x, oclko0x and oclko18x indicated by FIG. 9-(k) to FIG. 9-(n) are generated (⑤ in FIG. 9). It is noted that the internal clock signals oclke0x and oclke18x are generated according to the internal clock signal clkdz, and that the internal clock signals oclko0x and oclko18x are generated according to the internal clock signal clkdx. The internal clock signals oclke0x and oclko0x comprise only clocks with a phase 0°, assuming that a first clock of every two clocks composing the internal clock signals clkdz and clkdx is a clock with a phase 0°. Likewise, the internal clock signals oclke18x and oclko18x comprise only clocks with a phase 180°, assuming that a second clock of every two clocks composing the internal clock signals clkdz and clkdx is a clock with a phase 180°.

Additionally, the DLL circuit 59 adjusts the delay time so that a phase of a first clock with a phase 0° of the internal clock signal clkdz matches a phase of a clock with a phase 0° of the external clock signal ck appearing two clocks behind, as indicated by FIG. 9-(a) and FIG. 9-(i) (⑥ in FIG. 9).

As described above, by matching phases of the internal clock signals clkdz and clkdx to phases of the external clock signals ck and /ck, respectively, the first frequency divider 61 and the second frequency divider 65 can be synchronized with each other so that a stable data-output with the latency shown in FIG. 8 can be conducted.

Hereinafter, descriptions will be given of specific circuit examples of elements composing the semiconductor memory device shown in FIG. 7.

Figure 10:
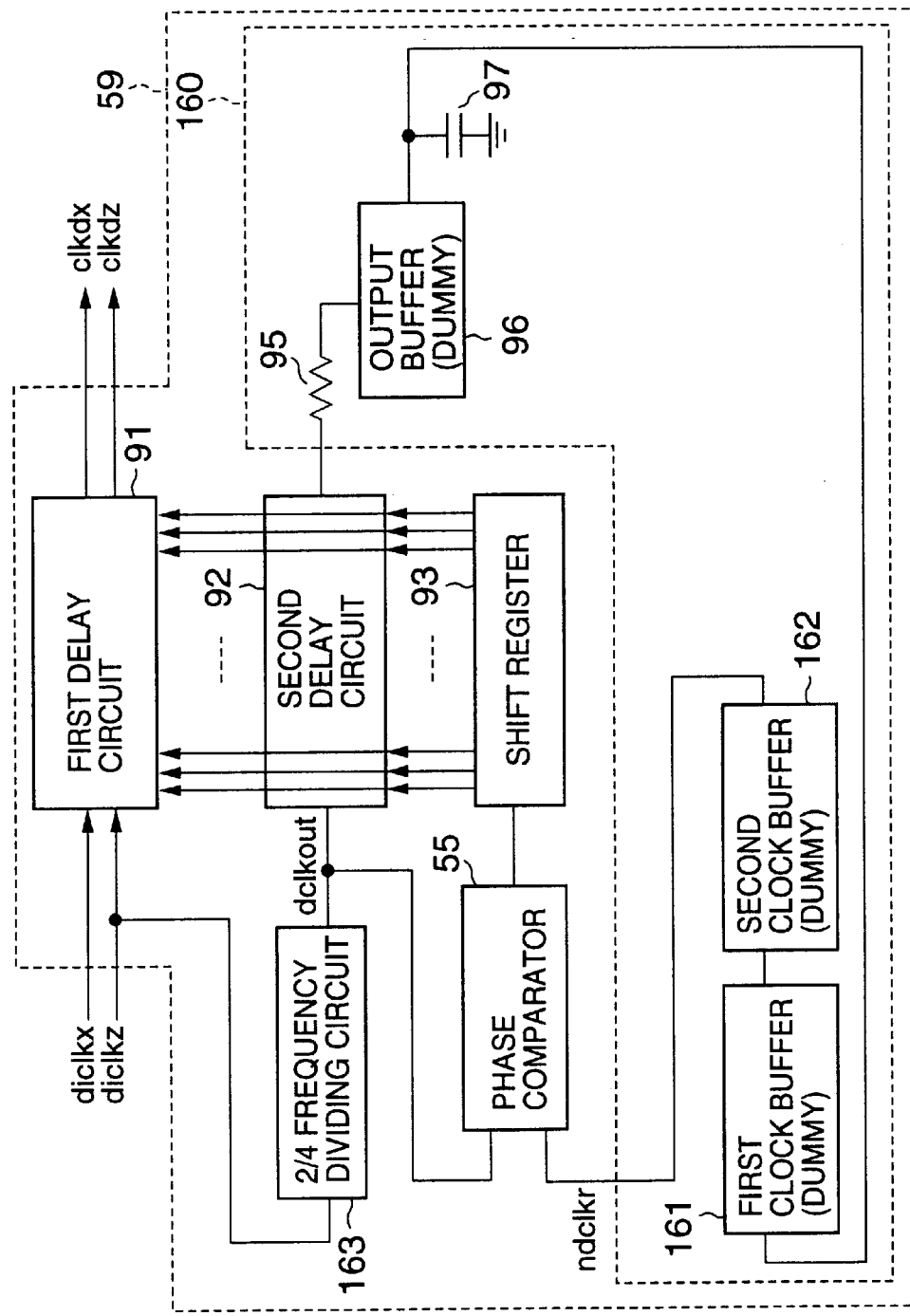
FIG. 10 is an illustration of a structure of a DLL circuit shown in FIG. 7.

FIG. 10 is an illustration of a structure of the DLL circuit 59 shown in FIG. 7. As shown in FIG. 10, the DLL circuit 59 comprises a replica circuit 160, the first delay circuit 91, the second delay circuit 92, the shift register 93, a ⅔ frequency dividing circuit 163, and the phase comparator 55. The first delay circuit 91 and the second delay circuit 92 have the same circuit structure. The replica circuit 160 comprises the resistance 95, the output buffer (dummy) 96, the dummy capacitance 97, a first clock buffer (dummy) 161, and a second clock buffer (dummy) 162, these elements being connected in series in this order. The ⅔ frequency dividing circuit 163 is supplied with the internal clock signal diclkz. The phase comparator 55 is connected to the ⅔ frequency dividing circuit 163 and the second clock buffer (dummy) 162. The input terminal of the shift register 93 is connected to the phase comparator 55, and the shift register 93 controls the second delay circuit 92. The input terminal of the second delay circuit 92 is connected to the ⅔ frequency dividing circuit 163, and the output terminal of the second delay circuit 92 is connected to the resistance 95. The second delay circuit 92 adjusts a delay time in the first delay circuit 91 so that the delay time in the first delay circuit 91 matches a delay time in the second delay circuit 92.

Here, the first delay circuit 91 is supplied with the internal clock signals diclkz and diclkx, and generates and outputs the internal clock signals clkdx and clkdz delayed by the same time as the delay time in the second delay circuit 92. Additionally, the above-mentioned replica circuit 160 has the same delay time as an "internal clock path", which is a path from the first clock buffers 51 and 52 via the first delay circuit 91 to the output buffer 31, because the replica circuit 160 has the same structure of circuits as the "internal clock path".

Next, a description will be given of operations of the above-mentioned DLL circuit 59. An optimal number of delay stages in the first and second delay circuits 91 and 92 is specified by the shift register 93. The shift register 93 is controlled by the phase comparator 55. The phase comparator 55 compares a dummy clock signal ndclkr supplied from the replica circuit 160 and a clock signal dclkout supplied from the ⅔ frequency dividing circuit 163, and controls the shift register 93 so that a phase of the dummy clock signal ndclkr is delayed from a phase of the clock signal dclkout by two periods of the internal clock signal diclkz. Thereby, the delay time in the "internal clock path" becomes a time equivalent to two periods of the internal clock signal diclkz. Therefore, output data are varied at rise times of the external clock signal ck, regardless of a frequency of the external clock signal ck.

It is noted that the ⅔ frequency dividing circuit 163 has a frequency division rate of 4 so that the phase comparator 55 conducts the above-mentioned phase comparison based on a clock two clocks behind the corresponding clock of the signals supplied to the first delay circuit 91.

Figure 11:
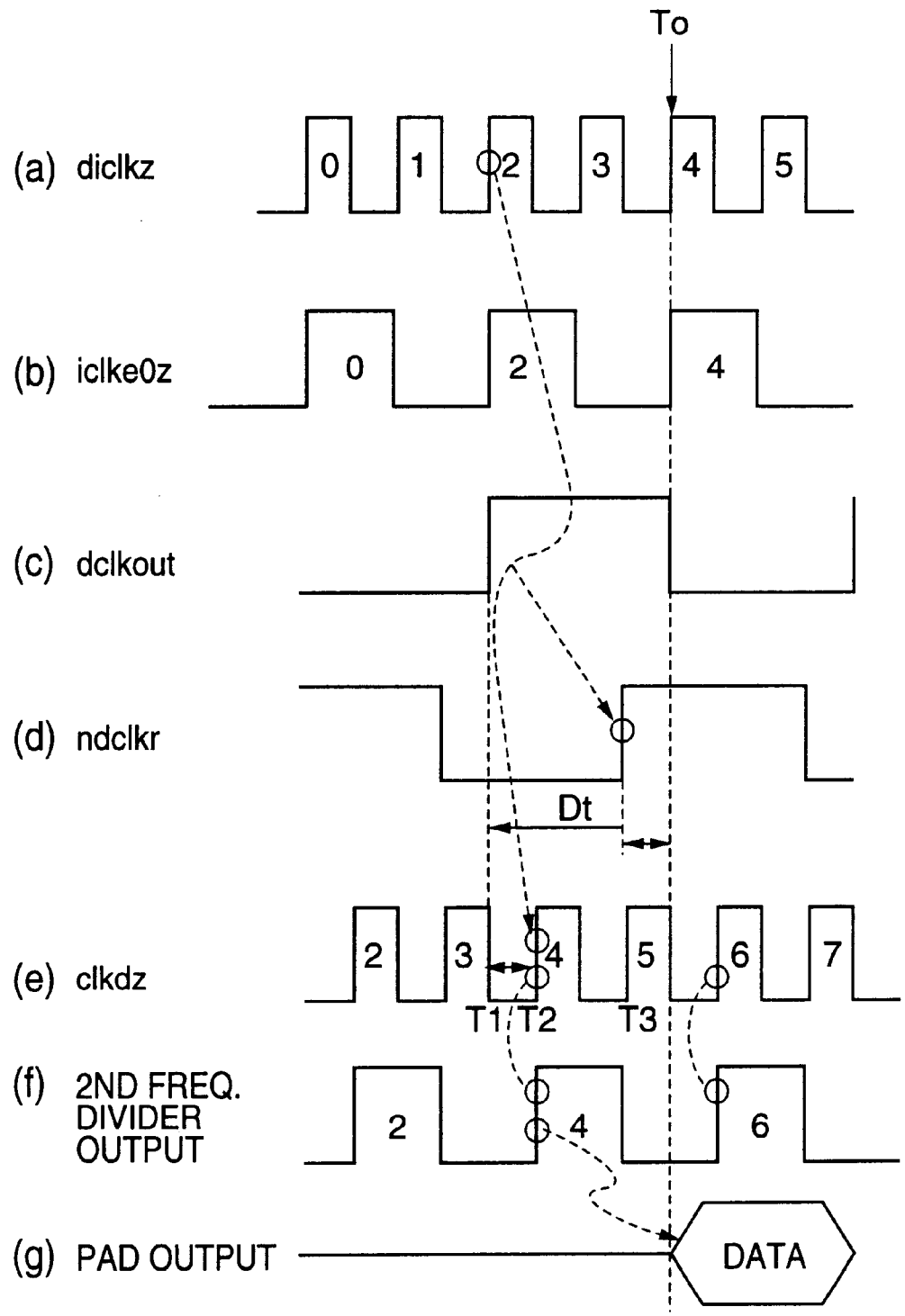
FIG. 11 is a waveform diagram indicating operations of the DLL circuit shown in FIG. 10.

Hereinbelow, a more detailed description will be given, with reference to FIG. 11, of operations of the above-mentioned DLL circuit 59. FIG. 11 is a waveform diagram indicating the operations of the DLL circuit 59 shown in FIG. 10. It is noted that, in this description, data is output at the time To.

First, the internal clock signal diclkz indicated by FIG. 11-(a) is produced based on the external clock signal ck supplied to the pad 1. Additionally, the internal clock signal diclkz is frequency-divided by the first frequency divider 61 shown in FIG. 7, so that the internal clock signal iclke0z indicated by FIG. 11-(b) is generated. It is noted that, as indicated by FIG. 11-(a) and FIG. 11-(b), clocks of the internal clock signal diclkz are numbered with sequential integers from 0, and clocks of the generated internal clock signal iclke0z are numbered with the same numbers, i.e., the same even numbers, as the clocks of the internal clock signal diclkz having the same rise time.

Then, a frequency of the internal clock signal diclkz is divided by 4 in the ⅔ frequency dividing circuit 163 so that the clock signal dclkout indicated by FIG. 11-(c) is generated. Then, this clock signal dclkout is transmitted through the second delay circuit 92 and the replica circuit 160 so that the dummy clock signal ndclkr indicated by FIG. 11-(d) is generated. As indicated by FIG. 11-(d), a phase of the dummy clock signal ndclkr is delayed from a phase of the clock signal dclkout by a delay time Dt in the replica circuit 160.

At the time To, the phase comparator 55 adjusts the shift register 93 so that a rising edge of the dummy clock signal ndclkr matches a falling edge of the clock signal dclkout. Thereby, the delay time in the second delay circuit 92 and the first delay circuit 91 is made a time from a time T3 to the time To. Therefore, as indicated by FIG. 11-(e), the internal clock signal clkdz output from the first delay circuit 91 is delayed from the internal clock signal diclkz supplied to the first delay circuit 91 by a time from a time T1 to a time T2, which is the same time as the time from the time T3 to the time To. For example, as indicated by FIG. 11-(e), a clock numbered 4 of the internal clock signal clkdz corresponds to a clock numbered 2 of the internal clock signal diclkz.

Then, as indicated by FIG. 11-(f), at the time To, data is output from the pad 33 in response to the clock numbered 4 of the internal clock signal clkdz. As a result, the data is output in synchronization with a clock numbered 4 of the internal clock signal diclkz indicated by FIG. 11-(a).

The above-described operations of the DLL circuit 59 shown in FIG. 10 are characterized in that the phase of the dummy clock signal ndclkr supplied from the replica circuit 160 is adjusted to an edge of the clock signal dclkout supplied from the ⅔ frequency dividing circuit 163, the edge corresponding to a clock two periods behind of the internal clock signal diclkz supplied to the first delay circuit 91.

In this course, as described above, the first frequency divider 61 and the second frequency divider 65 need to be synchronized with each other. For example, when a phase of the external clock signal ck is 0° upon receiving a command, a phase thereof upon outputting data has to be adjusted also to be 0°. For this purpose, the first frequency divider 61 and the second frequency divider 65 need to start frequency-dividing simultaneously, and further, the DLL circuit 59 has to adjust the delay time therein for a clock 2n periods behind the corresponding clock of the clock signals supplied thereto (n is a natural number).

Therefore, if the ⅔ frequency dividing circuit 163 shown in FIG. 10 is replaced by a ½ frequency dividing circuit, the clock signal dclkout indicated by FIG. 11-(c) and the dummy clock signal ndclkr indicated by FIG. 11-(d) each have double the frequency. Then, in this case, the phase comparator 55 compares an edge generated at a rise time of a clock numbered 2 of the internal clock signal diclkz indicated by FIG. 11-(a) and an edge generated at a rise time of a clock numbered 3 thereof.

Thus, if the frequency dividing is conducted as mentioned above, when a phase of the external clock signal ck upon receiving a command is 0°, for example, a phase thereof upon outputting data becomes 180°. Because of this, a proper latency cannot be acquired, and data cannot be output at desired timings. It is noted that, if the beginning points of frequency-dividing of the first frequency divider 61 and the second frequency divider 65 are individually adjusted, the ½ frequency dividing circuit 94 can be substituted for the ⅔ frequency dividing circuit 163.

Figure 12:
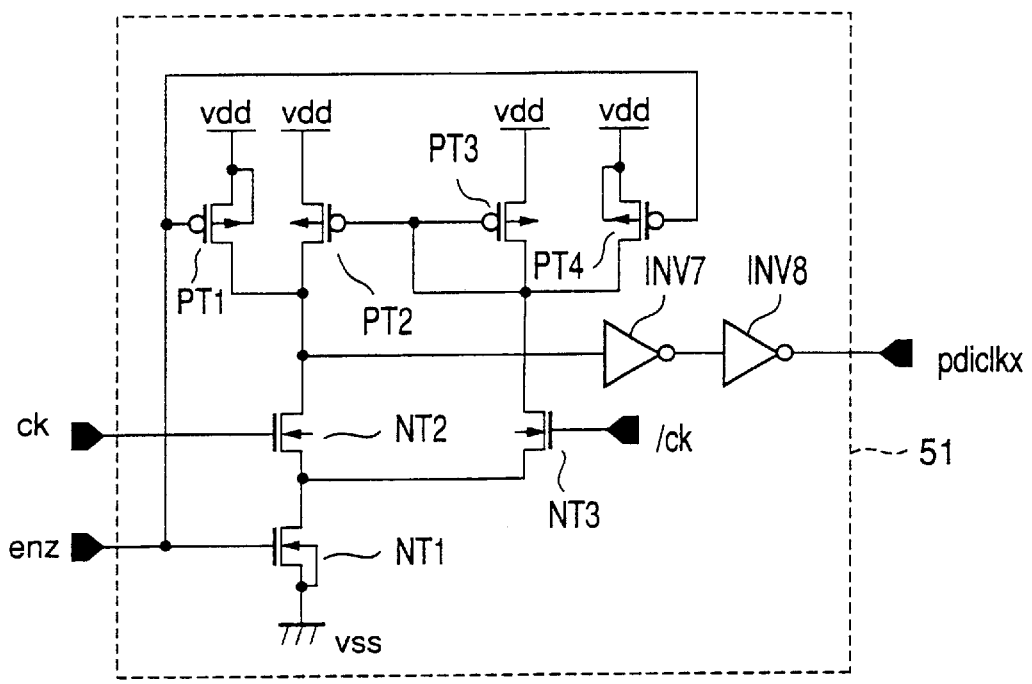
FIG. 12 is a circuit diagram of a first clock buffer shown in FIG. 7.

Next, a description will be given, with reference to FIG. 12, of the first clock buffer 51 shown in FIG. 7. FIG. 12 is a circuit diagram of the first clock buffer 51. It is noted that the first clock buffer 52 shown in FIG. 7 has the same structure as the first clock buffer 51.

As shown in FIG. 12, the first clock buffer 51 includes the N-channel MOS transistors NT1 To NT3, the P-channel MOS transistors PT1 to PT4, and inverters INV7 and INV8. The external clock signal ck is supplied to the gate of the N-channel MOS transistor NT2. The external clock signal /ck is supplied to the gate of the N-channel MOS transistor NT3. The enable signal enz is supplied to the gates of the N-channel MOS transistor NT1 and the P-channel MOS transistors PT1 and PT4.

When the enable signal enz becomes high-level so as to activate the first clock buffer 51, the internal clock signal pdiclkx according to the external clock signals ck and /ck is generated and is output.

Figure 13:
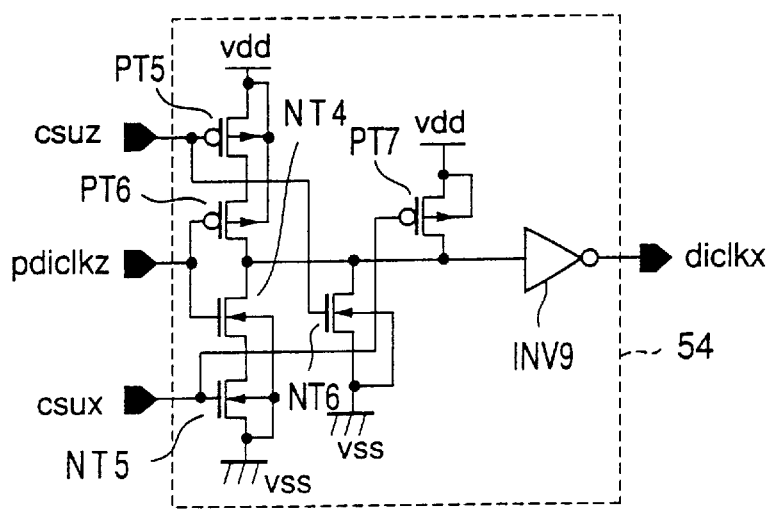
FIG. 13 is a circuit diagram of a second clock buffer shown in FIG. 7.

Next, FIG. 13 is a circuit diagram of the second clock buffer 54 shown in FIG. 7. As shown in FIG. 13, the second clock buffer 54 includes N-channel MOS transistors NT4 To NT6, P-channel MOS transistors PT5 to PT7, and an inverter INV9.

The signal csuz fixed at a low (L) level is supplied to gates of the N-channel MOS transistor NT6 and the P-channel MOS transistor PT5. The signal csux is supplied to gates of the N-channel MOS transistor NT5 and the P-channel MOS transistor PT7. The internal clock signal pdiclkz is supplied to gates of the N-channel MOS transistor NT4 and the P-channel MOS transistor PT6.

Then, when the signal csux becomes high-level, the second clock buffer 54 is activated so that the internal clock signal diclkx is output from the inverter INV9 according to the internal clock signal pdiclkz.

It is noted that the second clock buffer 53 shown in FIG. 7 has the same structure as the above-mentioned second clock buffer 54 shown in FIG. 13, except that the internal clock signal pdiclkx generated by the first clock buffer 51 is supplied in place of the above-mentioned internal clock signal pdiclkz, and the signal csux is fixed at a high (H) level. Then, when the signal csuz becomes low-level, the second clock buffer 53 is activated so that the internal clock signal diclkz is output from the inverter INV9 according to the internal clock signal pdiclkx.

Figure 14:
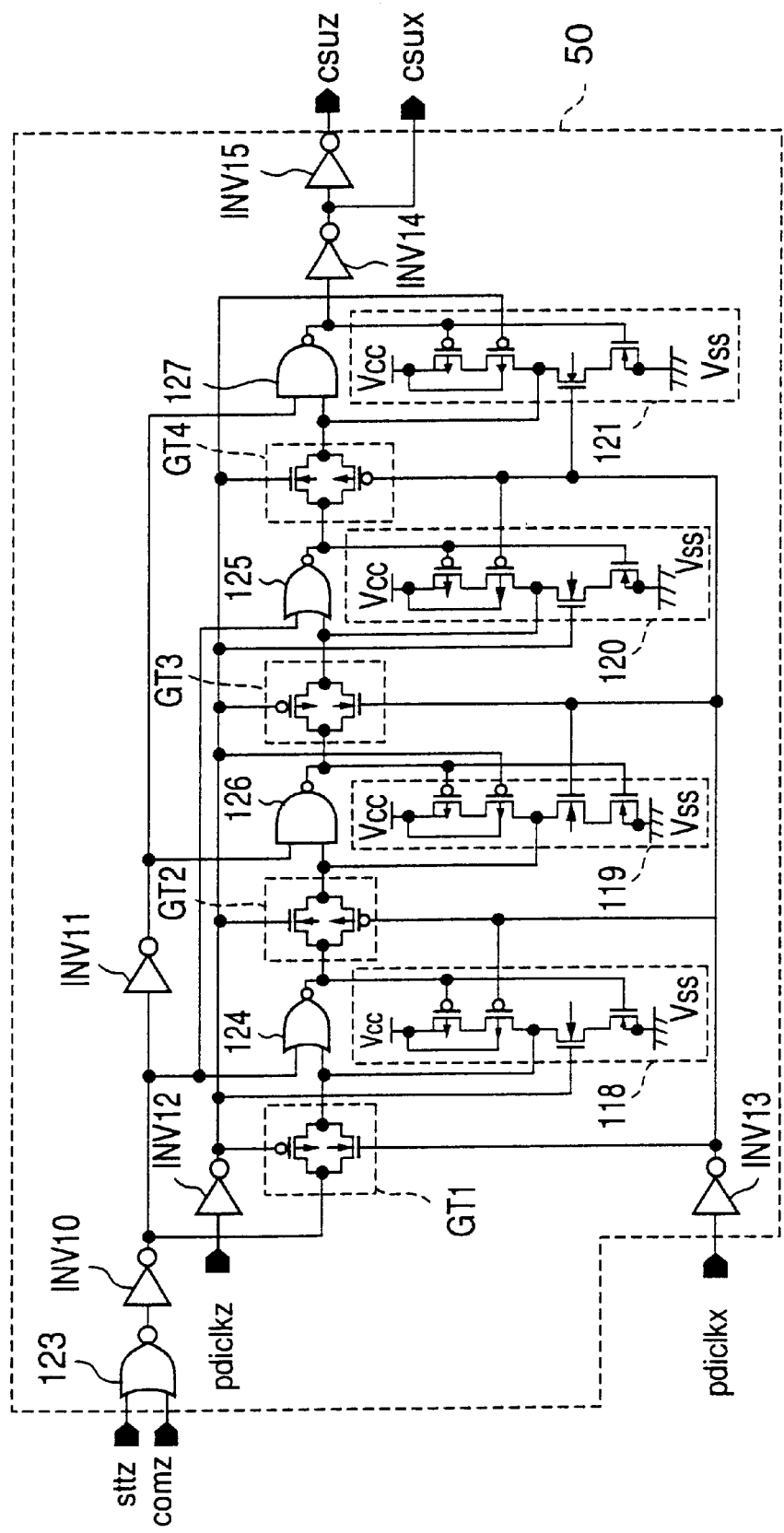
FIG. 14 is a circuit diagram of a reset circuit shown in FIG. 7.

Next, FIG. 14 is a circuit diagram of the reset circuit 50 shown in FIG. 7. As shown in FIG. 14, the reset circuit 50 includes NOR circuits 123 to 125, NAND circuits 126 and 127, inverters INV10 to INV15, gate circuits GT1 to GT4, and logic circuits 118 to 121. The NOR circuit 123 is supplied with the signal sttz and a command comz. The inverter INV12 is supplied with the internal clock signal pdiclkz. The inverter INV13 is supplied with the internal clock signal pdiclkx.

Then, when the signal sttz and the command comz become low-level, the reset circuit 50 is activated so that the signals csuz and csux according to the internal clock signals pdiclkz and pdiclkx are output from the inverters INV15 and INV14, respectively. Additionally, when the signal sttz and the command comz transit to a high level, the signal csuz is fixed at a high level, and the signal csux is fixed at a low level.

Figure 15:
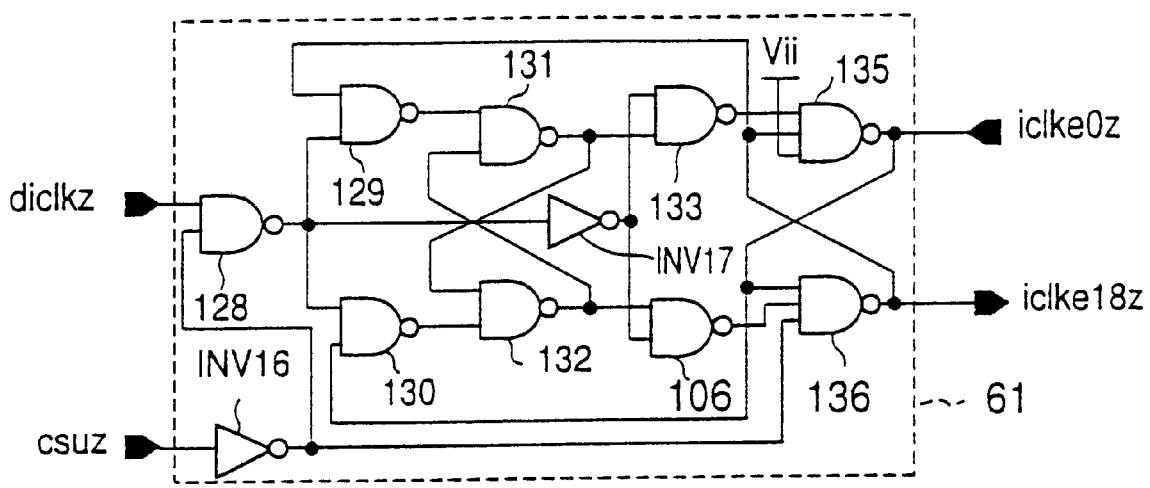
FIG. 15 is a circuit diagram of a first frequency divider shown in FIG. 7.

Next, FIG. 15 is a circuit diagram of the first frequency divider 61 shown in FIG. 7. As shown in FIG. 15, the first frequency divider 61 includes NAND circuits 128 to 136 and inverters INV16 and INV17. The internal clock signal diclkz is supplied to the NAND circuit 128, and the signal csuz is supplied to the inverter INV16. Then, when the signal csuz transits to a low level, the first frequency divider 61 is activated so that the internal clock signal iclke0z is output from the NAND circuit 135, and the internal clock signal iclke18z is output from the NAND circuit 136.

Figure 16:
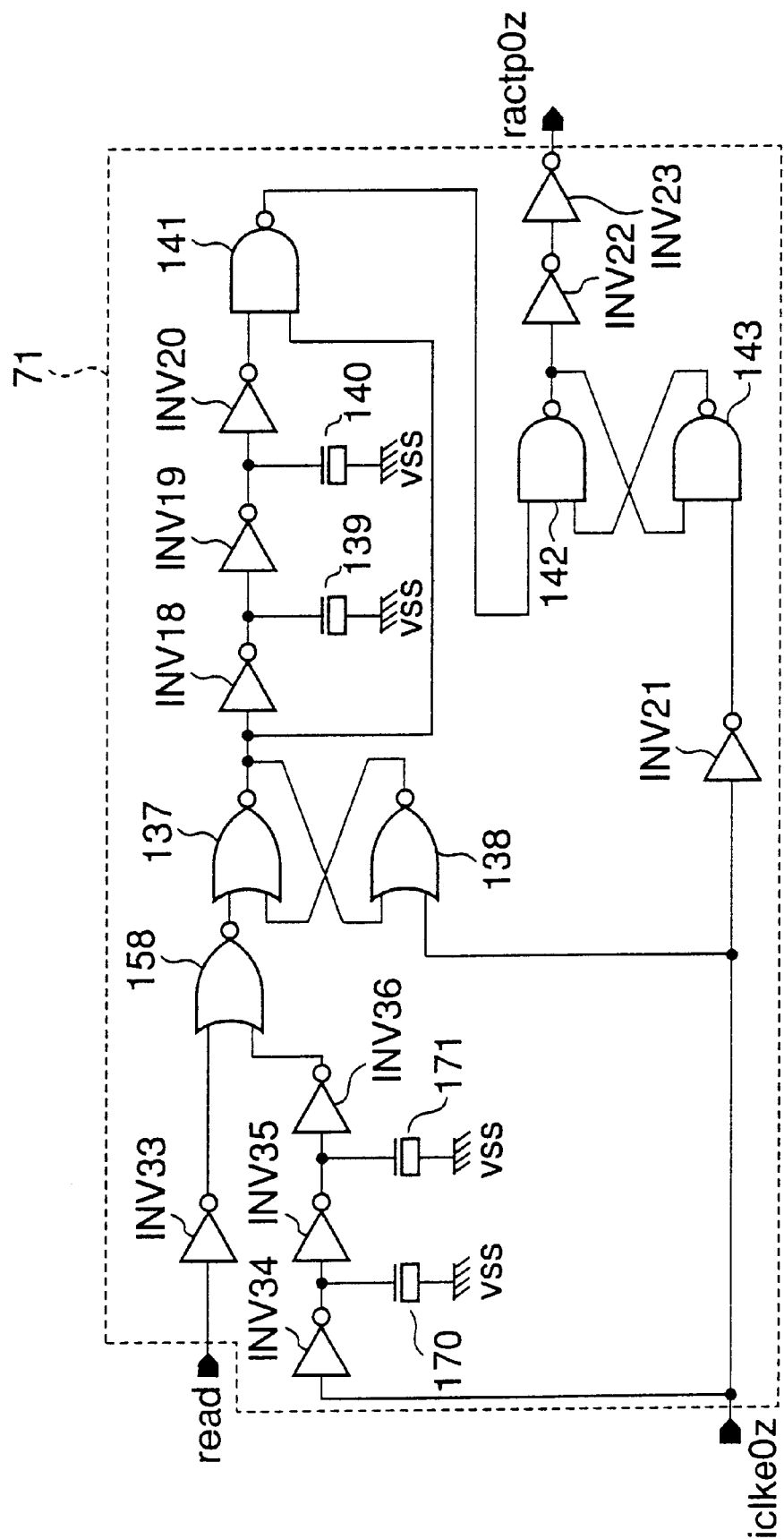
FIG. 16 is a circuit diagram of a read-command angle recognition circuit shown in FIG. 7.

Next, FIG. 16 is a circuit diagram of the read-command angle recognition circuit (0°) 71 shown in FIG. 7. It is noted that the read-command angle recognition circuit (180°) 75 shown in FIG. 7 has the same structure as the read-command angle recognition circuit (0°) 71 shown in FIG. 16.

As shown in FIG. 16, the read-command angle recognition circuit (0°) 71 includes NOR circuits 137, 138 and 158; NAND circuits 141 to 143; inverters INV18–INV23 and INV33–INV36; and MOS capacitors 139, 140, 170 and 171. The read-comand read is supplied to the inverter INV33. The internal clock signal iclke0z is supplied to the inverter INV21, the inverter INV34 and the NOR circuit 138. Then, when a phase of the read-command read and a phase of the internal clock signal iclke0z match each other, the signal ractp0z at a high level with a rectangular pulse is output from the inverter INV23.

Figure 17:
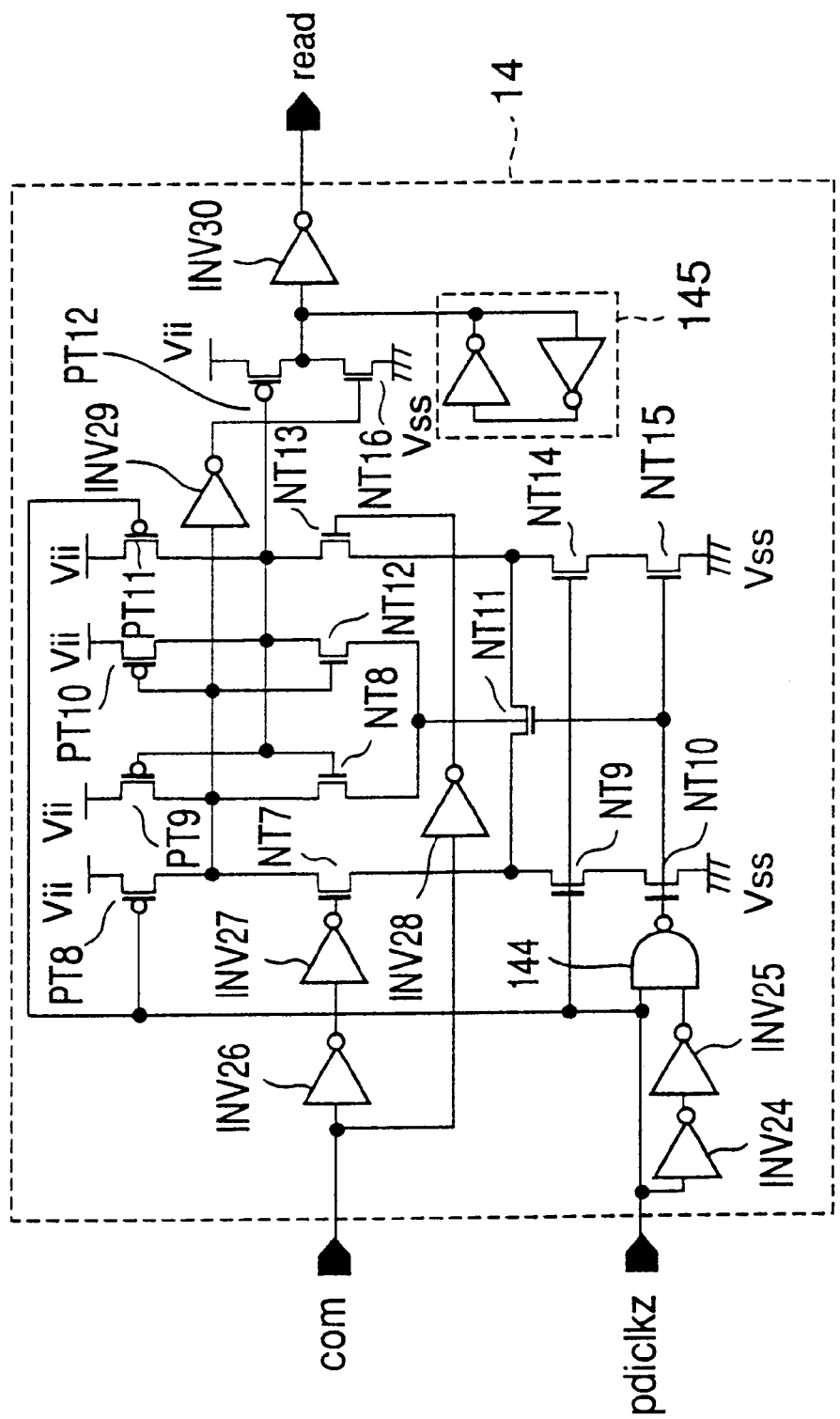
FIG. 17 is a circuit diagram of a command recognition unit shown in FIG. 7.

Next, FIG. 17 is a circuit diagram of the command recognition unit 14 shown in FIG. 7. As shown in FIG. 17, the command recognition unit 14 includes N-channel MOS transistors NT9 to NT16; P-channel MOS transistor PT8 to PT12; inverters INV24–INV30; a NAND circuit 144; and a latch circuit 145. The command com is supplied to the inverters INV26 and INV28. The internal clock signal pdiclkz is supplied to the inverter INV24, the NAND circuit 144, gates of the N-channel MOS transistors NT9 and NT14, and gates of the P-channel MOS transistor PT8 and PT11. The read-command read is output from the inverter INV30.

Figure 18:
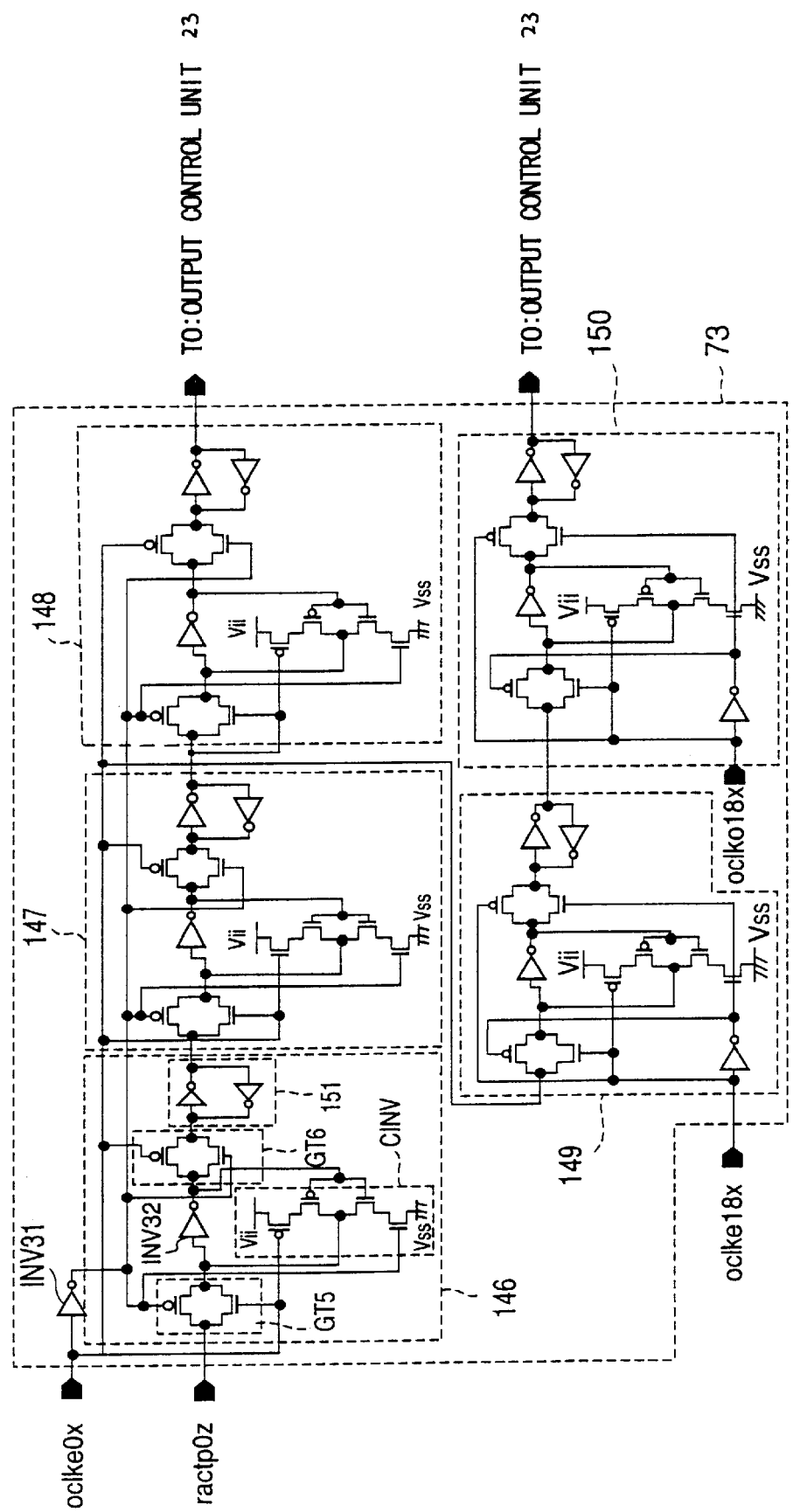
FIG. 18 is a circuit diagram of a counter shown in FIG. 7.

Next, FIG. 18 is a circuit diagram of the counter (0°) 73 shown in FIG. 7. It is noted that the counter (180°) 77 shown in FIG. 7 has the same structure as the counter (0°) 73 shown in FIG. 18.

As shown in FIG. 18, the counter (0°) 73 includes logic circuits 146 to 150 and an inverter INV31. The logic circuit 146 includes gates GT5 and GT6, an inverter INV32, a clocked inverter CINV, and a latch circuit 151. The signal ractp0z is suppied to the gate GT5.

The logic circuits 147 to 150 have the same structure as the above-mentioned logic circuit 146. The logic circuits 147 and 148 are serially connected to the logic circuit 146. The serially-connected logic circuits 149 and 150 are parallel-connected to the logic circuit 148. The internal clock signal oclke0x is supplied to the logic circuits 146, 147 and 148. The internal clock signal oclke18x is supplied to the logic circuit 149. The internal clock signal oclko18x is supplied to the logic circuit 150. Signals indicating results of counting are output from the logic circuits 148 and 150 to the output control unit 23.

Figure 19:
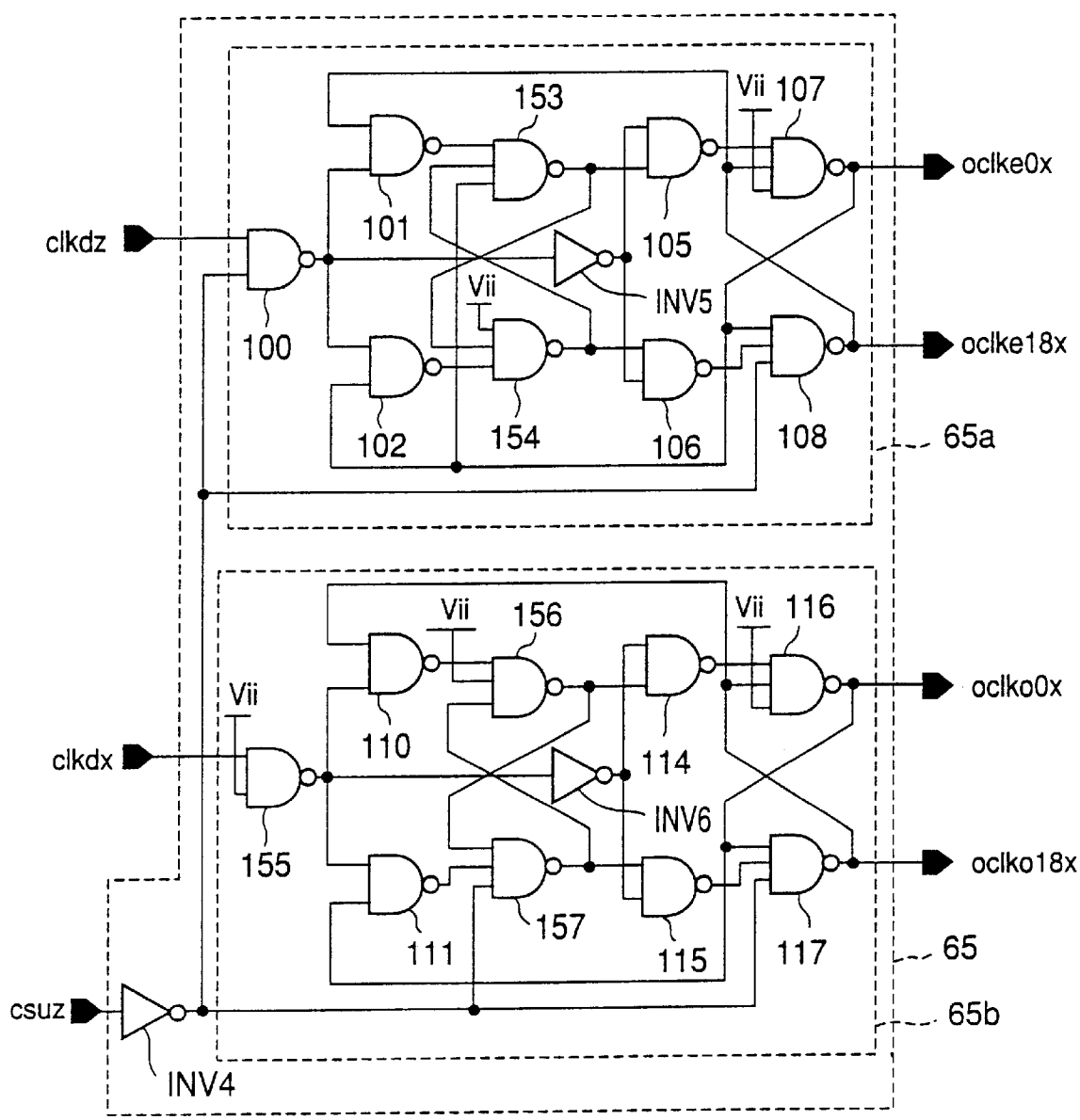
FIG. 19 is a circuit diagram of a second frequency divider shown in FIG. 7.

Next, FIG. 19 is a circuit diagram of the second frequency divider 65 shown in FIG. 7. As shown in FIG. 19, the second frequency divider 65 includes the inverter INV4, a first frequency dividing circuit 65a, and a second frequency dividing circuit 65b. The first frequency dividing circuit 65a includes the NAND circuits 100–102 and 105–108; NAND circuits 153 and 154; and the inverter INV5. The second frequency dividing circuit 65b includes the NAND circuits 110, 111 and 114-117; NAND circuits 155–157; and the inverter INV6.

The first frequency dividing circuit 65a frequency-divides the internal clock signal clkdz so as to generate the internal clock signals oclke0x and oclke18x. The second frequency dividing circuit 65b frequency-divides the internal clock signal clkdx so as to generate the internal clock signals oclko0x and oclko18x. It is noted that the second frequency divider 65 is reset by the signal csuz supplied to the inverter INV4. Additionally, the NAND circuits 153 and 157 are supplied with a reverse signal of the signal csuz supplied from the inverter INV4. The NAND circuits 154 to 156 are supplied with an internal power supply voltage Vii.

As described above, according to the semiconductor memory device of the present embodiment, since clock signals are frequency-divided by the first frequency divider 61 and the second frequency divider 65, frequencies of internal clock signals and an internal operating frequency are decreased. Therefore, even when frequencies of the external clock signals ck and /ck become high, a reliable internal operation, more specifically, a reliable data output operation can be achieved.

Additionally, since internal clock signals supplied to the DLL circuit 59 are not frequency-divided with respect to the external clock signals ck and /ck, a number of signals can be decreased so as to reduce a circuit scale of the DLL circuit 59 and an amount of consumed electric current thereof. Further, the decreased circuit scale of the DLL circuit 59 advantageously enhances a precision of signal lines included in the DLL circuit 59 so as to increase a precision of delaying performed by the DLL circuit 59.

The present invention is not limited to the specifically disclosed embodiments, and variations and modifications may be made without departing from the scope of the present invention.

The present application is based on Japanese priority application No. 2000-095826 filed on Mar. 30, 2000, the entire contents of which are hereby incorporated by reference.

What is claimed is:

1. A semiconductor memory device for outputting data in synchronization with an external clock signal, the device comprising:

a first frequency divider dividing a frequency of the external clock signal supplied thereto so as to generate a first internal clock signal;

a delay circuit delaying said external clock signal;

a second frequency divider dividing a frequency of a signal supplied from said delay circuit so as to generate a second internal clock signal; and a data control unit outputting the data according to said first internal clock signal and said second internal clock signal.

2. The semiconductor memory device as claimed in claim 1, wherein said delay circuit supplies a signal having a phase different from a phase of said external clock signal by N periods, where N is an integer other than zero.

3. The semiconductor memory device as claimed in claim 1, wherein said delay circuit adjusts a phase of said external clock signal supplied thereto by delaying the external clock signal by 2n periods, where n is a natural number.

4. The semiconductor memory device as claimed in claim 1, further comprising a reset circuit simultaneously starting said first frequency divider and said second frequency divider.

5. The semiconductor memory device as claimed in claim 4, wherein said reset circuit starts said first frequency divider and said second frequency divider upon being provided with a power supply.

6. The semiconductor memory device as claimed in claim 4, wherein said reset circuit is controlled by a command supplied from outside.

7. A semiconductor memory device having a clock buffer buffering an external clock signal supplied thereto, and a data control unit outputting predetermined data according to a data control signal supplied thereto, the device outputting said data in synchronization with said external clock signal, the device comprising:

a delay circuit delaying a signal generated by said clock buffer;

a first frequency divider dividing a frequency of said signal generated by said clock buffer so as to generate a first internal clock signal;

a second frequency divider dividing a frequency of a signal supplied from said delay circuit so as to generate a second internal clock signal; and an output control unit generating said data control signal according to said first internal clock signal and said second internal clock signal.

* * * * *